(12) United States Patent
Prud'Homme et al.

(10) Patent No.: US 7,935,754 B2
(45) Date of Patent: *May 3, 2011

(54) AUTOMOTIVE BODY PANEL CONTAINING THERMALLY EXFOLIATED GRAPHITE OXIDE

(75) Inventors: Robert K. Prud'Homme, Lawrenceville, NJ (US); Ilhan A. Aksay, Princeton, NJ (US); Douglas Adamson, Skillman, NJ (US); Ahmed Abdala, Suez (EG)

(73) Assignee: The Trustees of Princeton University, Princeton, NJ (US)

( * ) Notice: Subject to any disclaimer, the term of this patent is extended or adjusted under 35 U.S.C. 154(b) by 231 days.

This patent is subject to a terminal disclaimer.

(21) Appl. No.: 12/194,016

(22) Filed: Aug. 19, 2008

(65) Prior Publication Data
US 2009/0054578 A1    Feb. 26, 2009

Related U.S. Application Data

(63) Continuation of application No. 11/249,404, filed on Oct. 14, 2005, now Pat. No. 7,658,901.

(51) Int. Cl.
*C01B 31/04* (2006.01)
(52) U.S. Cl. ........................ 524/495; 423/448
(58) Field of Classification Search ................ 423/448; 524/495
See application file for complete search history.

(56) References Cited

U.S. PATENT DOCUMENTS

| 4,987,175 | A | 1/1991 | Bunnell, Sr. |
| 5,019,446 | A | 5/1991 | Bunnell, Sr. |
| 5,065,948 | A | 11/1991 | Bunnell, Sr. |
| 5,876,687 | A | 3/1999 | Hung |
| 6,596,396 | B2 | 7/2003 | Hirata et al. |
| 6,828,015 | B2 | 12/2004 | Hirata et al. |
| 6,927,250 | B2 | 8/2005 | Kaschak et al. |
| 7,071,258 | B1 | 7/2006 | Jang et al. |
| 7,105,108 | B2 | 9/2006 | Kaschak et al. |
| 7,658,901 | B2 | 2/2010 | Prud'Homme et al. |
| 7,745,528 | B2 * | 6/2010 | Prud'Homme et al. ...... 524/495 |
| 7,771,824 | B2 | 8/2010 | Herrera-Alonso et al. |
| 2002/0054995 | A1 | 5/2002 | Mazurkiewicz |
| 2004/0127621 | A1 | 7/2004 | Drzal et al. |
| 2005/0271574 | A1 | 12/2005 | Jang et al. |
| 2006/0121279 | A1 | 6/2006 | Petrik |
| 2006/0229404 | A1 | 10/2006 | Lechtenboehmer |
| 2007/0142547 | A1 | 6/2007 | Vaidya et al. |
| 2009/0233057 | A1 | 9/2009 | Aksay et al. |
| 2010/0096595 | A1 | 4/2010 | Prud'Homme et al. |

FOREIGN PATENT DOCUMENTS

JP    2006-225473    8/2006

OTHER PUBLICATIONS

Celzard, et al., "Modelling of Exfoliated Graphite", Progress in Materials Science (www.elsevier.com/locat/pmatsci), Jan. 1, 2004, pp. 1-87.
"Graphite", http://web.archive.org/web/20050827075854/http://en.wikipedia.org/wiki/Graphite, Aug. 20, 2005, 3 pages.
U.S. Appl. No. 12/208,706, filed Sep. 11, 2008, Aksay.
U.S. Appl. No. 12/208,692, filed Sep. 11, 2008, Korkut, et al.
U.S. Appl. No. 12/194,030, filed Aug. 19, 2008, Prud'Homme, et al.
U.S. Appl. No. 12/194,054, filed Aug. 19, 2008, Prud'Homme, et al.
U.S. Appl. No. 12/208,682, filed Sep. 11, 2008, Prud'Homme, et al.
U.S. Appl. No. 12/194,037, filed Aug. 19, 2008, Prud'Homme, et al.
U.S. Appl. No. 12/194,043, filed Aug. 19, 2008, Prud'Homme, et al.
U.S. Appl. No. 12/194,007, filed Aug. 19, 2008, Prud'Homme, et al.
U.S. Appl. No. 12/194,062, filed Aug. 19, 2008, Prud'Homme, et al.
U.S. Appl. No. 12/194,021, filed Aug. 19, 2008, Prud'Homme, et al.
I. Bautista, et al., "Localizaed N2 Adsorption on Graphites, Graphite Oxides and Exfoliated Graphites", Materials Chemistry and Physics, vol. 21, No. 4, 1989, pp. 335-343.
P. Ramesh, et al., "Preparation and physicochemical and electrochemical characterization of exfoliated graphite oxide", Journal of Colloid and Interface Science, vol. 274, 2004, pp. 95-102.
U.S. Appl. No. 12/791,190, filed Jun. 1, 2010, Prud'Homme, et al.
U.S. Appl. No. 12/866,089, filed Aug. 4, 2010, Crain, et al.
U.S. Appl. No. 12/866,079, filed Aug. 4, 2010, Crain, et al.
U.S. Appl. No. 12/866,306, filed Aug. 5, 2010, Aksay, et al.

* cited by examiner

*Primary Examiner* — Stuart Hendrickson
(74) *Attorney, Agent, or Firm* — Oblon, Spivak, McClelland, Maier & Neustadt, L.L.P.

(57) ABSTRACT

An automotive body panel containing a polymer composite formed of at least one polymer and a modified graphite oxide material, which is a thermally exfoliated graphite oxide with a surface area of from about 300 $m^2/g$ to 2600 $m^2/g$.

13 Claims, 22 Drawing Sheets

FIG. 7 A and B.

FIG. 11 A and B

FIG. 12 A and B

FIG. 16 A, B, C

AUTOMOTIVE BODY PANEL CONTAINING THERMALLY EXFOLIATED GRAPHITE OXIDE

CROSS REFERENCE TO RELATED APPLICATIONS

This application is a Continuation of U.S. patent application Ser. No. 11/249,404, filed Oct. 14, 2005, the entire contents of each of which are hereby incorporated by reference.

This invention was made with government support under Grant No. CMS0609049 awarded by the National Science Foundation and under Grant No. NCC-1-02037 awarded by NASA Langley Research Center. The government has certain rights in the invention.

BACKGROUND OF THE INVENTION

1. Field of the Invention

The present invention relates to a high surface area material based on modified graphite oxide.

2. Discussion of the Background

There has been considerable interest in the area of nanoparticle-filled polymer composites (NCs), in particular composites in which the nanoparticle has dimensions comparable to those of the polymer chains, has a high aspect ratio of more than 100 and is uniformly dispersed in the polymer matrix. There are several filler materials that have been extensively studied for improvement of mechanical properties, electrical and thermal conductivity of polymer composites, for example, fractal agglomerated nanoparticles (silica and carbon black), carbon nanotubes (CNTs), inorganic clays and alumina silicate nanoplates.

Initial attempts at producing nanoparticle-filled polymer composites often resulted in materials with inadequate nanoparticle dispersion and degraded mechanical properties. Although often impractical for industrial applications, small-scale dispersion methods involving solvent- or monomer based processing have occasionally yielded NCs with multifunctional capabilities and improved mechanical properties. Several problems remain that affect the development of NCs with consistent properties that are viable for use in real world applications: (1) many of the nanoparticles used are expensive (e.g., CNTs); (2) often chemical or mechanical manipulations must be performed to achieve good dispersion that are impractical for large-scale commercial production; and (3) problems of the interfacial energy mismatch of inorganic nanofillers with hydrocarbon polymer matrix phases result in processing and mechanical property difficulties.

A significant amount of work has been done with nanoclays. Nanoclay-reinforced composites have shown enhancements in stiffness, glass transition temperature, barrier resistance, and resistance to flammability in a variety of polymer systems. Nanoclays are also high aspect ratio nanoplates that are, like graphene, derived from inexpensive commodity materials (clays) and thus appropriate for comparison with the projected graphene polymer composites of the present invention. The in-plane modulus of clays should be similar to that of mica, which is ~178 GPa, significantly lower than the 1060 GPa value of graphene (value from graphite in-plane). Recent studies point out that the hydrophilicity of clays makes them incompatible with most polymers, which are hydrophobic. One approach is to render the clays organophilic through a variety of approaches (amino acids, organic ammonium salts, tetra organic phosphonium). Such clays are called "organoclays." These materials have suffered from the cost of the added interfacial modifiers and the instability of these modifiers under processing conditions. In addition, it has been difficult to homogeneously disperse these organoclays in polymer matrices.

Carbon nanotubes have also generated significant interest as nanofillers. They have good mechanical properties and large aspect ratios, and their surfaces should be more compatible with hydrocarbon polymers than clay-based nanofillers. As a nanofiller, CNTs have several limitations, one of which is their cost of production. Since they are made in a gas-phase process, the production costs are more expensive than solution-based processes operating at high density. The production of single wall carbon nanotubes (SWCNTs) requires the addition of metal catalysts that must be removed to produce pure SWCNT materials, or results in the presence of heavy metal contaminants in the final materials if not removed.

Graphite is a "semi-metal," and recent efforts have demonstrated that extremely thin (few layers thick) nanoplates obtained from highly oriented pyrolytic graphite (HOPG) are stable, semimetallic, and have exceptional properties for metallic transistor applications.

Even though graphene sheets have the same $sp^2$ carbon honey comb structure as carbon nanotubes (CNTs), until now, it has not been possible to effectively produce the highly dispersed, thin sheets needed to make graphene applications possible.

SUMMARY OF THE INVENTION

It is therefore an object of the present invention to provide exfoliated graphite oxide.

It is another object of the present invention to provide a method for making exfoliated graphite oxide sheet, in particular thermally exfoliated graphite separated down to individual graphene sheets.

It is another object of the present invention to provide a material based on modified graphite that is appropriate, for example, as a nanofiller for polymer composites, a conductive filler for composites, an electrode material for batteries and ultracapacitors, as a filler to improve diffusion barrier properties of polymers, and as a hydrogen storage material.

It is another object of the present invention to provide a filler material that has dimensions comparable to those of polymer chains, has a high aspect ratio of more than 100 and can be uniformly dispersed in a polymer matrix.

It is another object of the present invention to provide a material based on modified graphite that is electrically conductive and can confer electrical conductivity when formulated with a polymer matrix.

It is yet another object of the present invention to provide a material based on modified graphite that has a high aspect ratio so that it can perform as a barrier to diffusion when incorporated in a polymer composite.

This and other objects have been achieved by the present invention the first embodiment of which includes a modified graphite oxide material, comprising a thermally exfoliated graphite oxide (TEGO) with a surface area of from about 300 $m^2/g$ to 2600 $m^2/g$, wherein said thermally exfoliated graphite oxide displays no signature of graphite and/or graphite oxide, as determined by X-ray diffraction (XRD).

In another embodiment, the present invention relates to a method of making the above TEGO.

DETAILED DESCRIPTION OF THE PREFERRED EMBODIMENTS

Figure 1:
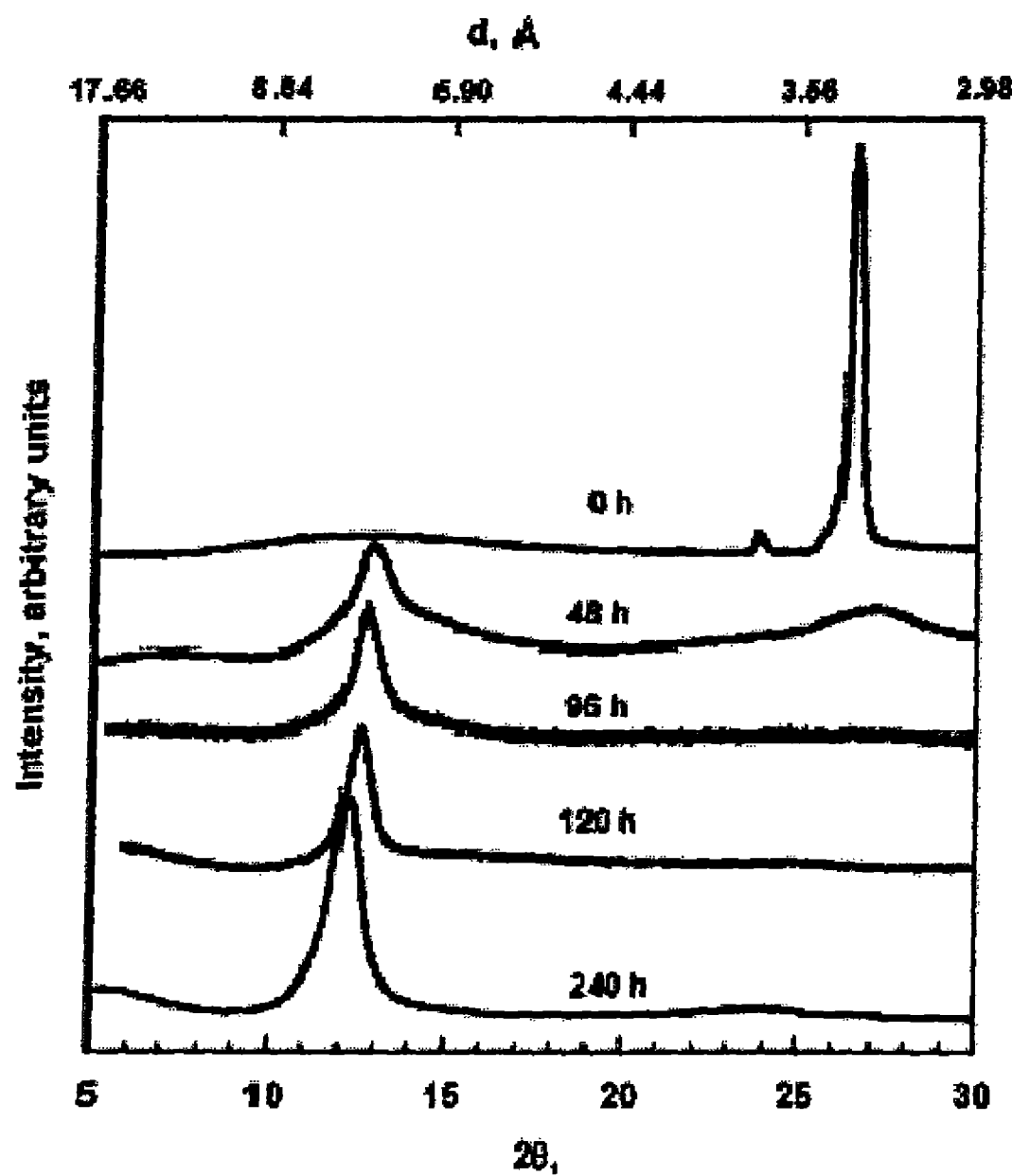
FIG. 1 illustrates XRD patterns of graphite and graphite oxide prepared by oxidation for different durations.

The relatively low cost of graphite as compared to CNTs make exfoliated graphite an attractive material. The use of graphite nanoplatelets (GNPs) is advantageous because of the chemistry of the graphene and graphene-like sheets compared to clay nanoplates. The inventors of the present invention have found that exceptionally rich chemistry of carbon can be utilized for interface engineering in composites and also for many other possible application areas, such as the use of graphene plates in nanoelectronics and sensors. Graphene and graphene-like plates are hydrophobic and thus compatible with a broad range of polymers and other organic materials, including proteins, and DNA. Additionally, it is possible to "tune" the wettability of graphene sheets through chemical coupling with functional groups.

Graphite or graphene sheets interact with each other through van der Waals forces to form layered or stacked structures. Theoretically, graphene sheets may have a surface area as high as 2,600 $m^2/g$, since they are composed of atomically thick layers. Graphite has anisotropic mechanical properties and structure. Unlike the strong $sp^2$ covalent bonds within each layer, the graphene layers are held together by relatively weak van der Waals forces. Due to this anisotropy, graphite has different properties in the in-plane and c-axis direction.

The chemical modification of graphite to intercalate and oxidize the graphene sheets has been described in the literature. Intercalation, a process in which guest materials are inserted into the "gallery" of host layered materials, creates a separation of these sheets beyond the 0.34 nm spacing of native graphite. Layered materials that form intercalation compounds include graphite, boron nitride, alkali metal oxides and silicate clays. Among these materials, graphite and boron nitride are the only solid layered materials that are composed of atomically thin sheets of atoms and are unique in their ability to form "stages" in which a monolayer of guest intercalant is separated by n multilayers of host to form "stage-n" compounds. The intercalation process usually involves chemical reaction and charge transfer between the layered host material and reagent, resulting in the insertion of new atomic or molecular intercalant layers. Due to its amphoteric nature, graphite can react with reducing or oxidizing agents, leading to the formation of either donor or acceptor type graphite intercalation compounds (GICs). For donor GICs, the intercalates (anions) donate electrons to the host layers, whereas for acceptor GICs the intercalates (cations) extract electrons from the host layers. The process of the present invention begins with, and is dependant on, the substantially complete intercalation of graphite to form stage n=1 graphite oxide.

The effect of intercalation on the bond lengths of the carbon atoms in bounding layers also depends on whether donors or acceptors are considered. Furthermore, with alkalis there is a small expansion over the pristine value of 1.420 Å that is roughly proportional to the valence and inversely proportional to the stage index and ionic radius of the metal. The intercalation process may result in deformation or rumpling of the carbon layer by the intercalant. A local buckling of the carbon layers may also occur.

The result of partial oxidation of graphite produces graphite oxide (GO). Many models have been proposed to describe the structure of graphite oxide. However, the precise structure of GO is still an area of active research.

A process of making expanded graphite materials with an accordion or "worm-like" structure has been proposed. These materials have many applications, including electromagnetic interference shielding, oil spill remediation, and sorption of biomedical liquids. The majority of these partially exfoliated graphite materials are made by intercalation of graphite with sulfuric acid in the presence of fuming nitric acid to yield expanded graphitic material. These expanded materials are then heated to yield an increase in the c-axis direction. While these materials are sometimes referred to as "expanded graphite" or "exfoliated graphite," they are distinct from the TEGO of the present invention. For these "worm-like" expanded graphite oxide materials, the individual graphite or GO sheets have been only partially separated to form the "accordion" structures. Although the heating results in an expansion in the c-axis dimension, the typical surface area of such materials is in the order of 10-60 $m^2/g$. Both the surface area below 200 $m^2/g$ and the presence of the 0002 peak of the pristine graphite corresponding to a d-spacing of 0.34 nm are indicative of the lack of complete separation or exfoliation of the graphene sheets. While the term "graphene" is used to denote the individual layers of a graphite stack, and graphite oxide denotes a highly oxidized form of graphite wherein the individual graphene sheets have been oxidized, graphene will be used to denote the layered sheet structure that may be in a partially oxidized state between that of native graphene and graphite oxide.

The present invention relates to a material based on modified graphite that is appropriate, for example, as a nanofiller for polymer composites, a conductive filler for composites, an electrode material for batteries and ultracapacitors, as a filler to improve diffusion barrier properties of polymers, and as a hydrogen storage material. The graphite nanoplatelet (GNP) material is distinct from previous graphitic materials, which lack one or more of the attributes required for a successful nanofiller. Also, the present invention relates to a material based on modified graphite that is electrically conductive and can confer electrical conductivity when formulated with a polymer matrix. The present invention further relates to a material based on modified graphite that has a high aspect ratio so that it can perform as a barrier to diffusion when incorporated in a polymer composite.

Figure 4B:
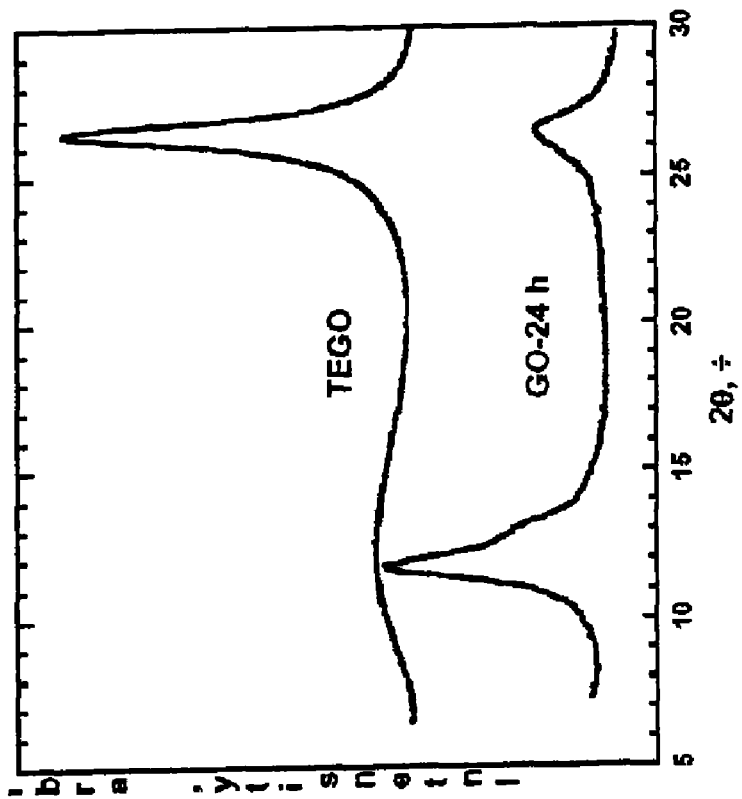
FIGS. 4a and 4b illustrate XRD patterns of TEGO and GO samples prepared by oxidation for 96 and 24 hours and rapidly expanded at 1050° C. The incompletely oxidized GO in FIG. 4b produces a more pronounced peak at 2θ≈26.5° after heat treatment.

More specifically, the present invention relates to a novel material based on exfoliation of oxidized graphite by a novel process. The initial step of the process is the intercalation and oxidation of natural graphite to form oxidized graphite, or graphite oxide (GO). The initial step causes the spacing between graphene layers to expand with loss of the native 0.34 nm spacing. During the expansion process, a peak associated with the 0.34 nm spacing as seen in XRD patterns will disappear and simultaneously a peak associated with a 0.71 nm spacing will appear. The best measure for substantially complete intercalation and oxidation of graphite is the disappearance of the 0.34 nm diffraction peak and its replacement with only the 0.71 peak. So far the literature has not reported such complete intercalation and oxidation of graphite. Substantially complete intercalation is represented, for example, in FIGS. 4 and 5. The resulting functional groups on GO, such as hydroxyl, epoxy, and carboxylic groups, alone or in combination, facilitate the retention of water molecules in the galleries between the GO layers. Rapidly heating the GO (after the 0.34 nm XRD peak is completely replaced by the 0.71 nm peak) results in superheating and volatilization of the intercalants, imbibed solvent, such as water and mixture of water with water-soluble solvents, and evolution of gas, such as $CO_2$, from chemical decomposition of oxygen-containing species in the graphite oxide. These processes, individually and collectively, generate pressures that separate or exfoliate the GO sheets. In the context of the present invention, the term "exfoliate" indicates the process of going from a layered or stacked structure to one that is substantially de-laminated, disordered, and no longer stacked. This procedure yields disordered GO sheets which appear as a fluffy, extremely low density material with a high surface area. Disordered GO shows no peak corresponding to 0.71 nm in the X-ray diffraction pattern. During rapid heating in an inert atmosphere, the GO is partially reduced and becomes electrically conductive. The rate of heating can be at least about 2000° C./min, preferably higher than 2000° C./min. The inert atmosphere is not particularly limited as long the gas or gas mixture is inert. Preferably, nitrogen, argon or mixtures thereof are used. In addition, reducing atmospheres may be used, such as carbon monoxide, methane or mixtures thereof. The TEGO can be readily dispersed in polar solvents and polymers, and can be used, for example, in composites as nanofillers, in ultracapacitors, as dispersants, and as hydrogen storage materials.

The water enters through interactions with the polar oxygen functionality and the ionic intercalants. But water is not an intercalant.

The water retention in the galleries between the water molecules may be 1 to 500%, preferably 1 to 300%, and most preferably 1 to 100% by weight based on the total weight of the GO. The water retention includes all values and subvalues there between, especially including 5, 10, 20, 40, 60, 80, 100, 150, 200, 250, 300, 350, 400, 450% by weight based on the total weight of the GO. The water used is preferably deionized water, preferably water having a resistivity between 100 and 0.2 MΩ/cm, more preferably between 50 to 0.2 MΩ/cm, most preferably between 18 to 0.2 MΩ/cm. The resistivity includes all values and subvalues there between, especially including 0.5, 1, 2, 3, 4, 5, 6, 7, 8, 9, 10, 11, 12, 13, 14, 15, 16 and 17 MΩ/cm.

The solvent for conducting the oxidation of graphite to produce graphite oxide is not particularly limited. While the preferred medium is water, co-solvents or additives can be used to enhance wetting of the hydrophobic graphite flakes. Solvents and/or additives may be used alone or in combination. Preferred additives include alcohols such as methanol, ethanol, butanol, propanol, glycols, water soluble esters and ethers, surfactants such as non-ionic ethylene oxide, propylene oxide and copolymers thereof, alkyl surfactants such as the Tergitol family surfactants, or the Triton family of surfactants, or surfactants with ethylene oxide and propylene oxide or butylene oxide units. Examples of these include the Pluronic or Tetronic series of surfactants. Cosolvents and surfactants can be used at levels from 0.0001 to 10 wt. % of the solution phase. The amount of cosolvents and surfactants includes all values and subvalues there between, especially including 0.0005, 0.001, 0.005, 0.01, 0.05, 0.1, 0.5, 1, 1.5, 2, 2.5, 3, 3.5, 4, 4.5, 5, 5.5, 6, 6.5, 7, 7.5, 8, 8.5, 9 and 9.5% by weight based on the solution phase.

The polar functional groups on TEGO, are preferably hydroxyl, epoxy groups and carboxylic acid groups or their derivatives. These polar groups can be functionalized using molecules that are reactive toward these polar functional groups. More than one type of functional groups may be included. For example, alkyl amines and dialkyl amines can be used to add hydrophobicity to the surface by reaction to epoxides, and can be used to covalently crosslink the TEGO surfaces. Acid chlorides can react with hydroxyls to add alkyl groups. Reactions of amines or hydroxyls with carboxylic acids can be used to attach groups to make the surface more hydrophobic by adding alkyl groups. The surfaces can be made more hydrophilic by adding ethylene oxide, primary and secondary amines and acid functionality using, for example the chemistries listed above. An important class of modification includes the grafting of species on the surface to increase the cohesive interactions between the filler surface and polymer matrices. These grafting agents can include low molecular weight analogs of the polymer matrix phase, or polymers with the same composition as the matrix phase that have reactive functionality. These might include polyethylene or polypropylene copolymers of vinyl acetate or maleic anhydride or their mixtures to induce compatibility between TEGO and olefin polymers.

Intercalants include but are not limited to inorganic acids or their salts, alone or in mixtures, preferably $HNO_3$, $H_2SO_4$, $HClO_4$, $KClO_4$.

Gases evolved during heating include water vapor from bound water between the GO layers, oxides of sulfur $SO_x$ and $H_2S$ from intercalated sulfates not removed by washing, oxides of nitrogen $NO_x$ if nitrates are used as intercalants, $CO_2$, $CO$, and $C_nH_mO_o$ species from partial reduction and elimination of oxygenated species from the GO precursor. X, m, n, o are numbers, preferably integers. More than one kind of gas may evolve during the heating. In one embodiment, IR-spectra of the decomposition products in the vapor phase during exfoliation show the presence of $SO_2$, $CO_2$ and water in the unwashed GO sample and only $CO_2$ and water in the washed sample. The SO2 arises from decomposition of the intercalated sulfate ions, and the $CO_2$ comes from decomposition of oxygenated species on GO. Minor amounts of higher carbon number evolved gaseous products may be produced. And if nitrate intercalants are used there may be NOx species released.

The rapid heating in an inert gas atmosphere occurs as follows. Rapid heating of the GO precursor is required to successfully produce TEGO. If the temperature increase is too slow then evolved gases can escape through the lateral channels between GO sheets without building pressures great enough to exfoliate the GO. Inadequate heating rates can occur because the temperature gradient between the sample and the oven is too low, the temperature gradient is applied too slowly, or too large of a sample is processed at one time so that heat transfer resistances inside the GO bed result in slow heating of the interior of the sample bed. Temperature gradients on the order of 2000° C./min produce TEGO materials of surface areas as high as 1500 $m^2/g$. This corresponds to 30 second heating times in a 1050° C. tube furnace. Heating rates of 120° C./min produced TEGO samples with only 500 $m^2/g$. Gradients even higher will produce even greater exfoliation, with the limit being the theoretical maximum value of 2600 $m^2/g$. In order to attain the maximum surface area, it may necessary to colloidally disperse TEGO in polar solvent and measure the surface area by adsorption methods in solution. This will ensure that all the surface area is available as a result of colloidal dispersion. In addition to the rate of increase of heating, the final temperature must be great enough to nucleate boiling of the water and decomposition of the GO oxides and intercalated ions. Thermal gravimetric studies indicate that temperatures of greater than 250° C. are required for complex vaporization of volatile components. If the GO is exposed to temperatures greater than 3000° C. excessive degradation of the GO structure may occur. However, that is the temperature experienced by the GO. GO samples exfoliated in flame burners may involve flame temperatures in excess of 3000° C., but short residence times in the flames or the cooling effects of vaporization of solvents or evolved gases may keep the temperature experienced by the particle less than 3000° C., even though the flame temperature is greater.

The TEGO increases the conductivity of polymeric matrices by factors of $10^{11}$ to $10^{18}$ over the range of filler loadings between 0.1 to 20 wt %, preferably 1.5 and 5 wt %, based on the weight of the polymer composite or ink formulation. The amount of filler includes all values and subvalues there between, especially including 0.5, 1, 1.5, 2, 2.5, 3, 3.5, 4 and 4.5 wt %. This corresponds to conductivity increases from $10^{-19}$ S/m to $10^{-8}$-$10^{-1}$ S/m for a 1.5 to 5 wt % loading of TEGO in PMMA. Higher conductivities above 0.01 to 1000 S/m can be attainable in more highly filled composite or ink formulations. The basic conductivity of the individual TEGO sheet is on the order of ½ to 1/10 of the conductivity of graphite based on the percentage of oxygens that disrupt the pure $sp^2$ graphitic structure. Commonly reported values for the in-plane conductivity of pure graphite sheets are 2 to $5 \times 10^5$ S/m.

Polymers in which TEGO can be dispersed include, but are not limited to: polyethylene, polypropylene and copolymers thereof, polyesters, nylons, polystyrenes, polycarbonates, polycaprolactones, polycaprolactams, fluorinated ethylenes, polyvinyl acetate and its copolymers, polyvinyl chloride, polymethylmethacrylate and acrylate copolymers, high impact polystyrene, styrenic sheet molding compounds, polycaprolactones, polycaprolactams, fluorinated ethylenes, styrene acrylonitriles, polyimides, epoxys, and polyurethanes. Elastomers that can be compounded with TEGO include, but are not limited to, poly[4,4'-methylenebis(phenyl isocyanate)-alt-1,4-butanediol/poly(butylene adipate)], poly [4,4'-methylenebis(phenyl isocyanate)-alt-1,4-butanediol/ poly(butylene adipate)], poly[4,4'-methylenebis(phenyl isocyanate)-alt-1,4-butanediol/poly(butylene adipate)], poly[4, 4'-methylenebis(phenyl isocyanate)-alt-1,4-butanediol/di (propylene glycol)/polycaprolactone, poly[4,4'-methylenebis(phenyl isocyanate)-alt-1,4-butanediol/ polytetrahydrofuran, amine terminated polybutadiene such as HYCAR ATB2000×173, carboxyl terminated polybutadiene such as HYCAR CTB2000×162, polybutadiene, dicarboxy terminated butyl rubber, styrene/butadiene copolymers, polyisoprene, poly(styrene-co-butadiene), polydimethysiloxane, and natural latex rubber. The polymers may be use alone or in combination.

It is possible to compound TEGO into the monomeric precursors of these polymers and to effect the polymerization in the presence of the TEGO nanofiller. The polymers and/or their precursors may be use alone or in combination.

Polar solvents into which TEGO can be dispersed include water, n-methylpyrolidone (NMP), dimethylormamide (DMF), tetrahydrofuran (THF), alcohols, glycols such as ethylene glycol, propylene glycol and butylene glycol, aliphatic and aromatic esters, phthalates such as dibutyl phthalate, chlorinated solvents such as methylene chloride, acetic esters, aldehydes, glycol ethers, propionic esters. Representative solvents of the desired classes can be found at the Dow Chemical web site (http://www.dow.com/oxysolvents/prod/ index.htm). The polar solvent may be used alone or in combination. Mixtures with non-polar solvents are possible.

The hydroxyl groups on the TEGO surface can be initiation sites from which polymer chains can be grown using controlled free radical polymerization (RAFT, ATR, NMP, or MADIX polymerization) schemes. Any monomer having a polymerizable can be used. Preferred monomers are aromatic monomers such as styrene, methacrylates, acrylates, butadienes and their derivatives. The monomers may be used alone or in mixtures.

The present invention relates to a thermally exfoliated graphite oxide (TEGO) produced by a process which comprises: (a) oxidizing and/or intercalating a graphite sample, resulting in a graphite oxide with expanded interlayers; and (b) heating the graphite oxide to cause superheating and gas evolution from the intercalated water and/or solvent, the intercalant, and the decomposition of the graphite oxide. The rapid increase in pressure substantially exfoliates or disorders the GO layer stacking.

Figure 4A:
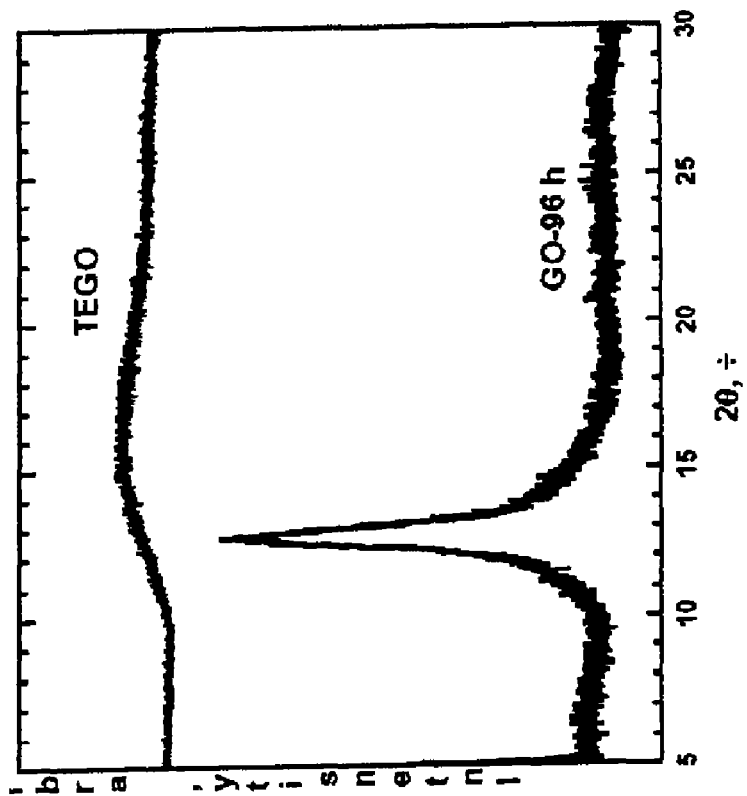
Figure 5:
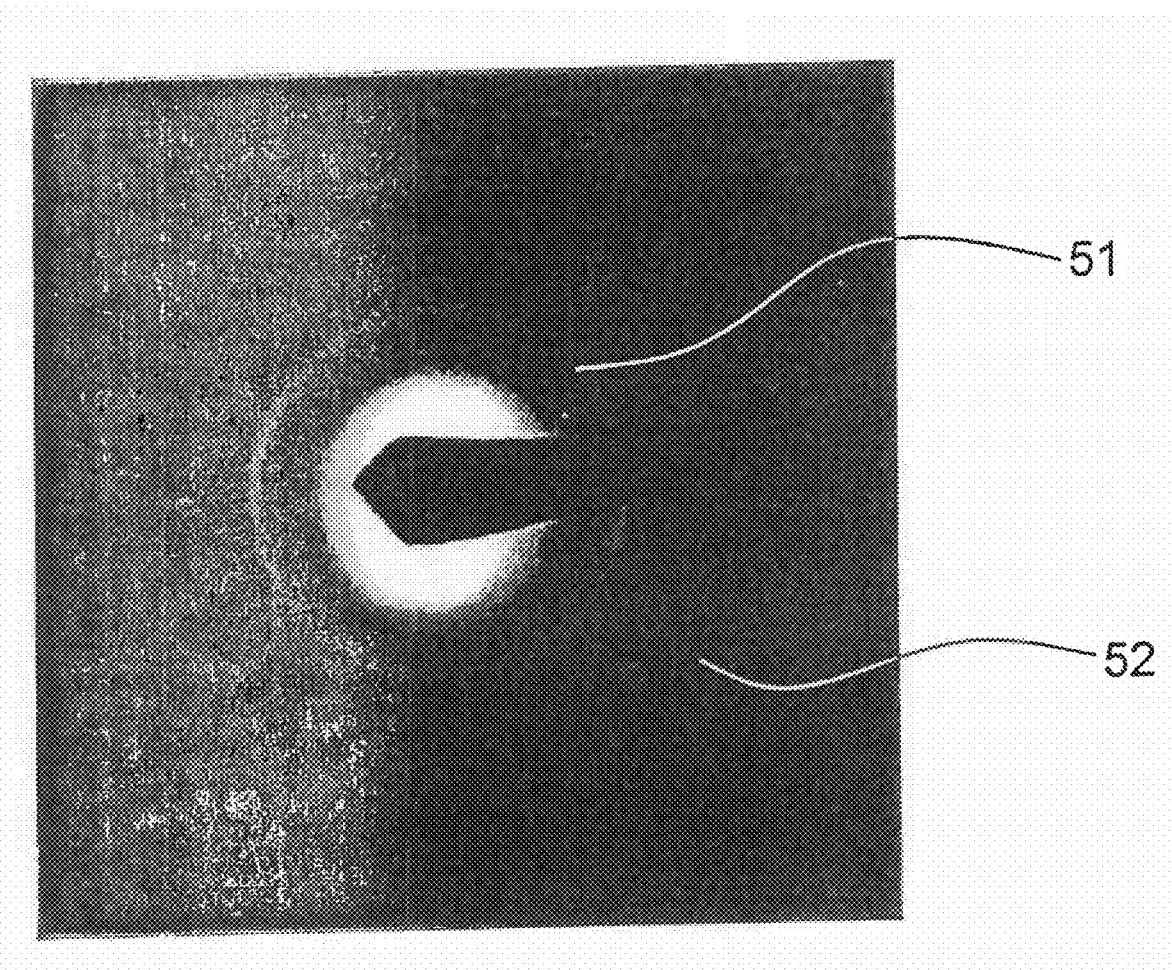
FIG. 5 shows a Selected Area Electron Diffraction (SAED) pattern of TEGO produced from fully oxidized GO (96 hours) with no structure in the diffraction rings. The structure of TEGO is found to be totally disordered commensurate with the XRD information in FIGS. 4a and b.

Substantial exfoliation of TEGO is defined by the absence of a X-ray diffraction peak from the original graphite peak at $2\theta \sim 26.5°$ (0.34 nm separation distance between the graphene sheets), as shown by comparing the XRD pattern in FIG. 4a for TEGO and the original XRD pattern for pure graphite in FIG. 1. There is less than 1% peak area in the range of $2\theta$ between 24 and 29° relative to the area of the broad TEGO peak between $2\theta$ of 10-20°. Improper or incomplete exfoliation can result in materials shown in FIG. 4b which show the presence of the graphite peak and the broad TEGO peak. This material is not the material we refer to in this patent as TEGO. For the TEGO material described in the present invention, the area under the diffraction peak between $2\theta=12.5$ and 14.5°, which is from the original GO sheet (see FIG. 4a), is less than is less than 15% of the total area under the TEGO peak between $2\theta=9$ and 21°.

The present invention further relates to a method for manufacturing TEGO which comprises the steps noted above. The heating in step b) may take place in a furnace at a temperature of from 300 to 2000° C., preferably, 800 to 1200° C. and most preferably at about 1000° C. The temperature includes all values and subvalues there between, especially including 400, 500, 600, 700, 800, 900, 1000, 1100, 1200, 1300, 1400, 1500, 1600, 1700, 1800, and 1900° C. The higher the temperature, the shorter the heating time. The heating time also depends on the volume of the sample and on any limitations heat conduction may pose. A sample having a larger volume may require a longer heating time. The heating time is preferably between 1 sec and 5 min. The heating time includes all values and subvalues there between, especially including 5, 10, 20, 30, 40, 50, seconds, 1 min, 1.5, 2, 2.5, 3, 3.5, 4, 4.5 minutes.

In another embodiment, step b) may take place by spraying through a flame at a temperature of about 2500° C. The transit time in this case is in the order of a fraction of a second to about 1 second. The superheating in step b) refers to the local hating of the water between the sheet to a temperature of more than 100° C.

In a preferred embodiment, the process further comprises the steps of removing acids and salts from the graphene interlayers prior to heating the graphite oxide, as well as drying the graphite oxide to remove excess water and solvent, while leaving intercalated species, adequate water and solvent for exfoliation, prior to heating the graphite oxide. The salts being removed are the ionic species involved in the initial oxidation and intercalation. They include $H^+$, $K^+$, chlorate ions, nitrate ions, sulfate ions, and organic acids that may arise from decomposition of the graphite structure.

In the context of the present invention, the phrase adequate water refers to the following. During heating to produce exfoliated TEGO the superficial water that is water on the surfaces of the oxidized GO sheets must be removed. This can be done in a "predrying" step to reduce the water content to between 500 wt % to 0.5 wt % (weight of water to weight of dry GO).

The preferred water content for processes that involve heating GO granular powders is between 75% and 2% water, and the most preferred range is 20% to 5%. These powders are subsequently heated to induce exfoliation in a furnace, flame, fluidized bed, or microwave heating device. Heating may also occur in a larger tube or by a flame process one could spray in an aqueous slurry of the GO. In the flame process the excess (superficial) water would vaporize without causing exfoliation. During the evaporation of superficial water, the vaporization keeps the temperature around the boiling point of the solvent (i.e. ca 100° C.). Once the superficial water is evaporated, then the partially dried GO experiences the very high temperature and exfoliates.

Other processes for heating GO to rapidly expand it to TEGO may involve injecting slurries of GO in bulk aqueous solution into the heating device. These slurries may contain GO concentrations from 1-85 wt % GO based on the total weight of the slurry. The amount of GO includes all values and subvalues there between, especially including 5, 10, 15, 20, 25, 30, 35, 40, 45, 50, 55, 60, 65, 70, 75, and 80 wt. %. The slurries may be directly injected into a furnace which may be a tube furnace, a fluidized bed heater, a flame burner with a reducing zone, or a microwave chamber. The superficial water or solvent is initially evaporated and subsequently the GO with intercalated aqueous solvent is superheated and the GO is exfoliated.

The TEGO produced in accordance with the present invention preferably has a surface area of from about 300 $m^2/g$ to 2600 $m^2/g$, preferably 300 $m^2/g$ to 2400 $m^2/g$, more preferably 300 to 1100 $m^2/g$, a bulk density of from about 40 $kg/m^3$ to 0.1 $kg/m^3$ and a C/O oxygen ratio, after high temperature expansion, in the range of from about 60/40 to 95/5, with a range of about 65/35 to 85/15 particularly preferred. The maximum calculated surface area will be 2600 $m^2/g$, based on the surface area of a single graphite sheet. The surface area includes all values and subvalues there between, especially including 400, 500, 600, 700, 800, 900, 100, 110, 1200, 1300, 1400, 1500, 1600, 1700, 1800, 1900, 2000, 2100, 2200, 2300, 2400, and 2500 $m^2/g$. The bulk density includes all values and subvalues there between, especially including 0.5, 1, 5, 10, 15, 20, 25, 30, 35 $kg/m^3$. The C/O oxygen ratio includes all values and subvalues there between, especially including 65/35, 70/30, 75/25, 80/20, 85/15 and 90/10. High temperature expansion occurs in the temperature range of 250° C. or more, preferably at temperatures of from 250 to 3000° C.

The TEGO of the present invention displays essentially no signature of the original graphite and/or graphite oxide as determined by XRD, and is produced by a process that involves oxidation of layered graphite to produce graphite oxide, using a material selected from e.g., sulfuric acid, nitric acid, hydrogen peroxide, perchlorate, or hydrochloric acid as oxidizers. The oxidant is not particularly limited. Preferred oxidants include $KClO_4$, $HNO_3+KClO_3$, $KMNO_4+NaNO_3$, $K_2S_2O_8+P_2O_5+KMNO_4$, $KMNO_4+HNO_3$, $HNO_3$. Another preferred method is polarization at a graphite electrode by electrochemical oxidation. Mixtures or combinations of these oxidants may be used. The resulting thermally exfoliated graphite oxide functions as a nanofiller. The TEGO material displays essentially no signature of the original GO stacking as determined by XRD. The height of the X-ray peak between $2\theta=10-15°$ is less than 20% of the height of the peak between $2\theta=22-30°$ in the original GO material when X-ray measurements are calibrated for absolute scattering intensities. For improvement of mechanical properties, electrical and thermal conductivity of polymer composites, the aspect ratio of the nanofiller should be greater than 100, the filler should be of a size such that its minor dimension is comparable to the dimensions of the polymer chains, and the filler should be uniformly dispersed in the polymer network.

The thermally exfoliated graphite oxide (TEGO) of the present invention shows no visible sign of the 002 peak (either at 0.34 nm or 0.71 nm interplane separation distance) that characterizes graphitic materials neither in the XRD nor in the SAED patterns. In a preferred embodiment of the present invention, there are several steps involved in the preparation of TEGO: First is the complete intercalation and oxidation of graphite. This is needed so as to permit disruption of the London-van der Waals forces and to allow the incorporation of water or other volatile solvent molecules into the stack structure. The acids and salts are then removed from the graphene interlayers. The GO is then appropriately dried to remove excess water or solvent, while leaving adequate solvents and intercalants to effect exfoliation. The drying method is not particularly limited. Drying may take place at room temperature, at a temperature of from room temperature to 100° C., or in a vacuum oven. The GO is dried until the water or other solvent content is between 1 and 500% by weight, preferably, 1 to 300% by weight and most preferably 1 to 20% by weight, based on the total weight of the GO. The amount of water or other solvent includes all values and subvalues there between, especially including 1, 2, 3, 4, 5, 6, 7, 8, 9, 10, 11, 12, 13, 14, 15, 16, 17, 18 19, 20, 30, 40, 50, 60, 70, 80, 90, 100, 150, 200, 250, 300, 350, 400, and 450% by weight. Finally, the GO is rapidly heated to cause superheating of the intercalated water and the decomposition of the intercalants. This causes the intercalated water and the intercalants to vaporize or decompose faster than they can diffuse out of the interlayer spaces, generating large local pressures that force the graphite oxide layers apart. The result is the highly expanded TEGO structure with unique properties as a nanofiller.

The polarity of the TEGO surface can be modified to adjust the dispersion of the TEGO in liquid or polymeric matrices. This modification can be accomplished during processing by controlled the extent of reduction during exfoliation. This is accomplished by controlling the time and temperature history of the sample. After the initial exfoliation leaving the sample at an elevated temperature will result in less polar functionality. Exfoliation in an atmosphere with gas compositions favoring reduction will enhance reduction (such as CO or $CH_4$), and gas compositions with higher oxidative power will enhance polar functionality (such as mixed inert and oxygen gases). It is possible to alter the polarity of the TEGO surface after production by chemical reaction through the OH, epoxide, and carboxylate groups on the TEGO surface.

In spite of nearly 150 years of extensive research on graphite intercalation and expansion, complete exfoliation of graphite down to individual graphene sheets has not been achieved. Thus far, thermal or chemical expansion and exfoliation of graphite have only produced materials with surface areas <600 $m^2$/g, well below the theoretical value of ~2,600 $m^2$/g predicted for completely delaminated graphene sheets.

The rapid thermal expansion of GO of the present invention offers a unique opportunity for very thin nanoplates to be used as a nanoscale reinforcer in polymer matrices. Due to the presence of polar oxygen functional groups on the surface of what the present invention refers to as TEGO, a polymer with polar or potentially reactive side groups reinforced with TEGO has superior properties in comparison to similarly processed nanocomposites containing single-wall carbon nanotubes (SWCNTs) and traditional EG.

TEGO may be used in polymer composites, particularly in conductive polymer composites, as additive in elastomeric materials, in elastomer diffusion barriers, as hydrogen storage medium, as material for supercapacitors, in flexible electrodes, as adsorbent material, as dispersant, as lubricant, in coatings, particularly in coatings that require UV stability. Further TEGO can be used in glass or ceramic composites, in thermoelectric composite materials, as pigments in inks, or as UV protective filler in composites. TEGO can also be used for electromagnetic shielding, and oil spill remediation.

TEGO nanofillers can be added to polymer matrices to prepare polymer composites. The large aspect ratio of the nano-sheets and the very high surface area interfacing with the polymer matrix will produce composites with enhanced mechanical properties. Simulations (Gusev et al. Macromolecules 34 (2001) 3081) show that fillers with aspect ratios greater than 100 increase the tensile modulus at loading levels as low as 3%. Work on surface-modified clay nanosheets has shown enhancement in mechanical properties. However, the dielectric mismatch between the organic carbon matrix and the clay sheet has created problems in dispersion of clays in composites. Further, the elastic modulus of graphene sheets vs. clays provides an added advantage in tuning the elastic properties of the composites to higher stiffness values. The organic composition of TEGO and its surface functionality allows its incorporation into composites without extensive surface functionalization and with facile dispersion. Polymers that can be compounded with TEGO nanofillers include, but are not limited to: polyethylene, polypropylene and copolymers thereof, polyesters, nylons, polystyrenes, polycarbonates, polycaprolactones, polycaprolactams, fluorinated ethylenes, polyvinyl acetate and its copolymers, polyvinyl chloride, polymethylmethacrylate and acrylate copolymers, high impact polystyrene, styrenic sheet molding compounds, polycaprolactones, polycaprolactams, fluorinated ethylenes, styrene acrylonitriles, polyimides, epoxys, and polyurethanes. Elastomers that can be compounded with TEGO include, but are not limited to, poly[4,4'-methylenebis (phenyl isocyanate)-alt-1,4-butanediol/poly(butylene adipate)], poly[4,4'-methylenebis(phenyl isocyanate)-alt -1,4-butanediol/poly(butylene adipate)], poly[4,4'-methylenebis (phenyl isocyanate)-alt -1,4-butanediol/poly(butylene adipate)], poly[4,4'-methylenebis(phenyl isocyanate)-alt -1,4-butanediol/di(propylene glycol)/polycaprolactone, poly [4,4'-methylenebis(phenyl isocyanate)-alt-1,4-butanediol/ polytetrahydrofuran, amine terminated polybutadiene such as HYCAR ATB2000×173, carboxyl terminated polybutadiene such as HYCAR CTB2000×162, polybutadiene, dicarboxy terminated butyl rubber, styrene/butadiene copolymers, polyisoprene, poly(styrene-co-butadiene), polydimethysiloxane, and natural latex rubber. TEGO-polymer composites can be applied as building material reinforcements, wire coatings, automotive components (including body panels) etc.

The conductivity imparted by the conductive TEGO filler at low loading levels enables the preparation of conductive composites. The advantage of conductivity at low loadings is that the mechanical, and especially the fracture, properties of the composite are not compromised. The amount of TEGO in the polymer composite is 0.1 to 90%, preferably 1 to 80%, more preferably 5-50% by weight based on the total weight of the composite. Another preferred range is 0.1 to 5%, preferably 0.5 to 2% by weight based on the total weight of the composite. The conductive polymer composites find great utility in the area of electrostatic spray painting of polymer parts. The low levels of conductivity imparted by the TEGO allow dissipation of the charge from the charged aerosol drops. Electrostatic spraying eliminates "overspray" (i.e. spray that misses the target) and minimizes environmental hazards associated with aerosol sprays and solvents. The conductivity of TEGO also enables applications of electrical shielding, such as for computer housings. It can be used for making thermal overload protective devises wherein heat or excess current flow through the conductive composites causes an expansion of the matrix and a drop in conductivity as the TEGO sheets no longer percolate. The level of conductivity and decrease in conductivity upon heating can be tailored to make either current-limiting devices or thermal switches. Very conductive TEGO-polymer composites can be used as conductive inks and for making conductive circuitry. The lines or conductive features can be patterned by application of a polymer-TEGO-solvent fluid with subsequent drying. Polymers which can be employed in the production of conductive composites include, but are not limited to: polyethylene, polypropylene and copolymers thereof, polyesters, nylons, polystyrenes, polyvinyl acetates and its copolymers, polycarbonates, polyvinyl chloride, polymethylmethacrylate and acrylate copolymers, polycaprolactones, polycaprolactams, fluorinated ethylenes, high impact polystyrene, styrenic sheet molding compounds, styrene acrylonitriles, polyimides, epoxys, and polyurethanes. Elastomers that can be compounded with TEGO include, but are not limited to, poly[4,4'-methylenebis(phenyl isocyanate)-alt-1,4-butanediol/poly(butylene adipate)], poly[4,4'-methylenebis(phenyl isocyanate)-alt-1,4-butanediol/poly(butylene adipate)], poly[4,4'-methylenebis(phenyl isocyanate)-alt-1,4-butanediol/poly(butylene adipate)], poly[4,4'-methylenebis(phenyl isocyanate)-alt-1,4-butanediol/di(propylene glycol)/polycaprolactone, poly[4,4'-methylenebis(phenyl isocyanate)-alt-1,4-butanediol/polytetrahydrofuran, amine terminated polybutadiene such as HYCAR ATB2000×173, carboxyl terminated polybutadiene such as HYCAR CTB2000×162, polybutadiene, butyl rubber, dicarboxy terminated styrene/butadiene copolymers, polyisoprene, poly(styrene-co-butadiene), polydimethysiloxane, and natural latex rubber.

Currently, carbon blacks are added to elastomers to impart desirable mechanical properties. Most importantly the carbon black creates a modulus that increases with strain. This nonlinearity protects rubber from damage during large deformations. The TEGO filler will provide similar enhanced non-linear strain hardening to elastomers. The interface is similar to that of carbon black, but the flexibility of the TEGO nano-sheet enables deformation at low strains and hardening at higher deformations. The TEGO is superior to other clay nano-platelets that have been considered for these applications for two reasons: (1) the carbon structure of TEGO has better interfacial compatibility with elastomeric matrices than do inorganic clay sheets, and (2) the greater flexibility of the TEGO sheet, compared to clays, decreases interfacial fatigue and debonding. Polymers that can be compounded to produce elastomers with enhanced modulus and toughness include, but are not limited to, include, but are not limited to, poly[4,4'-methylenebis(phenyl isocyanate)-alt-1,4-butanediol/poly(butylene adipate)], poly[4,4'-methylenebis(phenyl isocyanate)-alt -1,4-butanediol/poly(butylene adipate)], poly[4,4'-methylenebis(phenyl isocyanate)-alt -1,4-butanediol/poly(butylene adipate)], poly[4,4'-methylenebis(phenyl isocyanate)-alt -1,4-butanediol/di(propylene glycol)/polycaprolactone, poly[4,4'-methylenebis(phenyl isocyanate)-alt-1,4-butanediol/polytetrahydrofuran, amine terminated polybutadiene such as HYCAR ATB2000×173, carboxyl terminated polybutadiene such as HYCAR CTB200×162, butyl rubber, polybutadiene, dicarboxy terminated styrene/butadiene copolymers, polyisoprene, poly(styrene-co-butadiene), polydimethysiloxane, and natural latex rubber.

Butyl rubber has excellent gas diffusion barrier properties and is, therefore, used as the lining for tubeless tires and for inner tubes. However it is significantly more expensive than other elastomers. Rubbers and elastomers that are used in tire applications do not have sufficient gas diffusion barrier properties to function in tire applications without the butyl rubber lining layer. TEGO nano platelets with aspect ratios between 1000 and 10,000 can provide excellent barrier properties when added to conventional rubbers and elastomers and oriented perpendicular to the direction of gas diffusion. Barrier properties of up to 1000 times greater than that of the unfilled rubber are possible. Elastomers that can be compounded to produce materials with enhanced barrier properties include, but are not limited to, poly[4,4'-methylenebis(phenyl isocyanate)-alt-1,4-butanediol/poly(butylene adipate)], poly[4,4'-methylenebis(phenyl isocyanate)-alt-1,4-butanediol/poly(butylene adipate)], poly[4,4'-methylenebis(phenyl isocyanate)-alt-1,4-butanediol/poly(butylene adipate)], poly[4,4'-methylenebis(phenyl isocyanate)-alt-1,4-butanediol/di(propylene glycol)/polycaprolactone, poly[4,4'-methylenebis(phenyl isocyanate)-alt-1,4-butanediol/polytetrahydrofuran, amine terminated polybutadiene such as HYCAR ATB2000×173, carboxyl terminated polybutadiene such as HYCAR CTB2000×162, butyl rubber, polybutadiene, dicarboxy terminated styrene/butadiene copolymers, polyisoprene, poly(styrene-co-butadiene), polydimethysiloxane, and natural latex rubber.

TEGO added to polymer films, packaging materials, flexible tubing for medical applications, suits for chemical and biological warfare, gloves for chemical protection and other applications required enhanced barrier properties are also achievable. Also, the metal liners used as gas diffusion barriers in glass or carbon fiber wrapped high-pressure gas storage cylinders add extra weight and reduce the cycle-life of the cylinders. TEGO filled gas diffusion barrier composites can be used to in place of the metal liners to improve the performance of high-pressure gas storage cylinders.

There is significant interest in materials for hydrogen storage. TEGO has three unique characteristics that make it attractive as a hydrogen storage medium that will operate at more moderate pressures and temperatures than conventional materials or carbon nano tubes. (1)

The ability to covalently "stitch" TEGO or graphite oxide layers using divalent chains allows the preparation of TEGO or graphite oxide sheets with interlayer spacings of approximately 1-1.4 nm. This is the predicted spacing that maximizes hydrogen storage between graphite sheets. Stitching can be accomplished, for example, with alkyl diamines reacting with the surface epoxides on the TEGO surfaces. The interlayer spacing is determined by the alkyl chain length. (2) The Stone-Wales defects introduced to the graphene sheet by oxidation provide enhanced hydrogen binding relative to binding to pure graphite sheets. (3) The polar functionality on TEGO can be used to localize metal clusters on the surface that act to dissociate diatomic hydrogen into molecular hydrogen and increase the rate of saturating and emptying the TEGO nano-sheet. This phenomenon is called "spillover" in the hydrogen storage literature. Only TEGO and graphite oxide have these multiple characteristics that make them effective hydrogen storage materials.

Supercapacitors are playing a significantly important role in hybrid energy sources. The material of choice in all commercial supercapacitors is high surface area carbon either as carbon aerogel or expanded graphite. TEGO provides an advantage over both materials in due to its higher surface area and planar structures.

The ability to make conductive TEGO dispersions and pastes, as well as conductive polymer composites opens the door for applications as electrodes for batteries, sensors, and electronic devices. The relative inertness of the TEGO graphitic sheet, coupled with its deformability makes it an attractive candidate for electrode applications. The planar structure of TEGO makes it an attractive material to make very thin electrodes for flat surface applications.

The high surface area of TEGO and the layered structure that is possible to achieve make it an attractive adsorbent material to compete with activated carbon. The gallery size between layers can be tailored by "stitching" (described above) to produce samples with interlayer spacings between 7.1 nm and 15 nm. Therefore, the adsorption can be tailored to optimize the binding of species with specific sizes. This size selectivity, polar sites on the TEGO surface, the ability to functionalize the TEGO surface, enable the production of adsorbents with unique size selectivity and chemical specificity. The size specificity is shown between molecules over a range of 1 to 50 nm, preferably 1-20 nm. The size includes all values and subvalues there between, especially including 5, 10, 15, 20, 25, 30, 35, 40 and 45 nm. It is especially useful in the separations of proteins.

Current absorbents and absorptive media for protein and DNA fragment separations are often based on silica or cellulose particulates in the size range of 10-1000 microns. The substrates provide mechanical support and reactive groups that can be used to couple ligands and functional groups to the particle surfaces. A disadvantage of the silica-based media is the relative instability of the particles and surface linkages at pH's above 8. The disadvantage of the cellulose-based supports is the relative difficulty in conjugating ligands and functionality to the hydroxyls on the cellulose surfaces.

The TEGO material combines the advantages of high surface area and readily functionalizable epoxide and carboxyl groups on the TEGO surfaces. In this invention the surface of the TEGO is made anionic by reaction of carboxylic acid and/or sulfonic acid containing reactants with amine functionality. The facile reaction with the TEGO epoxides under mild conditions of reflux conditions in ethanol enable surface modification. To provide anionic surfaces. Reaction with diamines provides amine surface functionality that can be further quaternized to create permanent cationic charge. Functionalization using reactions commonly employed to functionalize cellulose media can be used to functionalize through the TEGO surface hydroxides. Once the surface is functionalized with the ion exchange moiety or an affinity tag ligand, the surface can be further functionalized with PEG or dextran functional reagents to passivate the surface to make it resistant to protein adsorption or denaturation. The TEGO, thus functionalized can be used as a bulk filling for chromatography columns or can be compressed or agglomerated to make a macro-particulate media in the size range 10-5000 microns that can be used as a chromatography packing.

The native and functionalized TEGO can also be used as an adsorptive media for gas phase separations. The functionalized TEGO described above can be directly used as packings for gas chromatography applications.

The unique blend of hydrophilicity and hydrophobicity that arise from the polar and non-polar groups on the TEGO surface and its large platelet size make it an effective dispersant for oil in water and water in oil emulsions. Oils include alkanes, aromatic hydrocarbons, chlorinated hydrocarbons, heterocyclics, petroleum distillates ranging from light hydrocarbons ($C_4$-$C_8$), to heavy vacuum residuals (C18-C40+), natural oils such as corn, safflower, linseed, olive, grape seed, silicone fluids and oils, fatty acids and fatty acid esters. The polarity of the TEGO can be tuned by the exfoliation conditions. The degree of reduction during the high temperature treatment determines the balance of oxidized surface groups (polar) to reduced graphitic sites (nonpolar). Further, post reaction through the surface epoxides, amines, and hydroxyls can be used to further tune or modify polarity. The materials are especially effective at dispersing crude oil in water emulsions that are being used as drilling fluids in oil and gas operations, and as mobility control agents in the recovery of oil from tar sands (Canadian patent Exxon Chemical 2067177). They are especially preferred for emulsification of tars and asphaltenes in applications such as paving compounds and sealing compounds.

Graphite is an excellent lubricant especially in high temperature applications due easy sliding of graphene sheets over each other. We expect TEGO to display superior lubricating properties since the interactions between the graphene sheets are significantly weakened in comparison to graphite.

The UV light absorption capabilities of TEGO make it an attractive additive to coatings that must maintain stability exposed to sunlight. Coatings include preferably black coatings. TEGO can be used as an additive for roofing sealers, caulks, elastomeric roofing membranes, and adhesives.

TEGO absorbs UV radiation and can therefore be used to impart UV protection and to improve the lifetime of plastic components in outdoor use, such as hoses, wire coatings, plastic pipe and tubing etc.

TEGO can be added to a ceramic matrix to improve the electrical conductivity and the fracture toughness of the material. The partially oxidized surface of TEGO offers stronger interaction with the ceramic matrix, especially with metal oxides and silicon oxides in particular. For example, TEGO can be mixed with a silicon alkoxide material and then the silicon alkoxide can be condensed to form an amorphous material silicon oxide material containing well-dispersed TEGO nano-platelets. The hydroxyl and epoxide groups on the TEGO surface can condense with the silicon alkoxide to form strong covalent bonds between the matrix and the TEGO filler. Low loadings of TEGO in such materials impart improved fracture strength and conductivity. TEGO-glass and TEGO-ceramic composites can also be applied as thermoelectric materials. Similar techniques can also be used to create tinted and UV-protective grades of glass. TEGO can also be used to reinforce cement and in other building material applications.

Due to the very low loadings of TEGO required to impart electrical conductivity to a non-conductive matrix, TEGO can form composite materials with greatly enhanced electrical conductivities but with thermal conductivities approximately the same as those of the matrix materials. This combination leads to TEGO-composites with improved thermoelectric figures of merit. The matrix material for this application can be either organic or inorganic, with excellent thermoelectric properties expected from the TEGO-silica composites, as noted above. The electrical conductivity of and nature of the carrier (i.e. electrons versus holes) in the material can be tailored by altering the surface chemistry of the TEGO filler or by modifications to the matrix material.

Carbon black and other carbon materials are frequently used as a pigment in inks. The very small size of the TEGO nano-platelets can lead to an ink with an exceptionally high gloss (i.e. low surface roughness of the dried ink). The surface chemistry of TEGO can also be easily modified to produce different colors, tones and tints.

The conductive properties of TEGO enable its use in electromagnetic shielding. Applications such as the enclosures for computer housings, computer screens, electronic devices such as medical diagnostics, and consumer electronics often require screening so that electromagnetic signals are either contained in the device and do not escape to provide interference for other devices, or to prevent external fields from interfering with the electronic components inside the enclosure. Currently conductive carbon black fillers are often used in these applications or conductive expanded graphite fillers. The TEGO conductive fillers can be used in these applications at lower loading levels and with less deleterious impact on the mechanical properties of the polymer matrices. In addition to the TEGO being added to the structural polymer used in these applications, the TEGO can be incorporated into a solvent phased system with binder to make a conductive paint that can be applied to the interior of the housing to provide electromagnetic shielding.

Currently expanded graphite is used as an absorbent for oil spill remediation and for the cleanup of other hazardous organic liquid spills. The hydrophobic surfaces are wetted by oil and thereby bind and hold oil. Other compounds used for spill remediation are clays, but these must be surface treated to may them hydrophobic enough to bind organic liquids. The high surface area of TEGO and its hydrocarbon surfaces make it an excellent absorbent material for oil and organic liquids. The TEGO can be contained in large porous sacks made from polypropylene or polyethylene fabric or porous film. The low bulk density of TEGO make it attractive in that the amount of liquid that can be imbibed on a weight basis can be high. Liquid loadings between 100 to 10,000 wt:wt oil to TEGO can be achieved. In another embodiment the TEGO is co-processed with a polymeric binder in the form of a foam sheet. These open cell structure of the foam allow contact between the oil and the TEGO surfaces. The advantage of this system is that the absorbent system can be rolled for storage.

While the present invention shows a high surface area value for the exfoliated graphene by $N_2$ adsorption, this may not be the most relevant measure of the ability to disperse the graphene sheets, in, for example, a polymeric matrix. While adsorption measurements reflect porosity and surface area of three dimensional structures and powders, graphene comprises two-dimensional, flexible sheets. In the solid dry state the graphene sheets must be in contact, and the contact areas will occlude nitrogen intrusion in the adsorption measurement. A more appropriate analogy for graphene may be to consider it as a two-dimensional polymer. An important question for applications involving graphene in polymer matrices is the degree of dispersion, or the effective surface area, in the dispersed state. The present invention TEGO materials disperse readily in polar organic solvents such as THF to form a uniform dispersion.

Having generally described this invention, a further understanding can be obtained by reference to certain specific examples which are provided herein for purposes of illustration only, and are not intended to be limiting unless otherwise specified.

EXAMPLES

Materials and Methods:
SWCNTs (BuckyPearls, lot no. CTU3-2005B-2) from Carbon Nanotechnologies, Inc. (Texas, USA); PMMA ($M_w$=350000, PDI=2.7) from Polysciences (Warrington, Pa., USA); and organic solvents, all HPLC grade, from Fisher Scientifics (Hanover Park, Ill., USA) were used as received. Flake 1 Graphite was from Asbury Carbon Co. (Asbury, N.J., USA).

Preparation of Graphite Oxide (GO):
Graphite oxide was prepared from Flake 1 graphite according to the method of Staudenmaier (L. Staudenmaier, *Ber. Dtsh. Chem. Ges*, 31, 1481, (1898)). Graphite (1 g) was added to a 500-ml round-bottom flask containing a stirred and cooled (0° C.) mixture of concentrated sulfuric and nitric acid (2:1 v/v, 27 ml). Potassium chlorate (11 g) was then added gradually in small portions to ensure that the temperature of the reaction mixture did not rise above 30° C. After the addition of potassium chlorate, the mixture was allowed to reach room temperature and stirring was continued for 96 h. Next, the mixture was poured into deionized water (1 l) and filtered over a 60-ml fritted funnel (coarse). The product was washed on the funnel with 5% aqueous HCl until sulfates were no longer detected (when 5-ml of the aqueous filtrate does not turn cloudy in the presence of one drop of saturated aqueous $BaCl_2$) and then with deionized water (2×50 ml). The resulting graphite oxide was dried in an oven at 100° C. for 24 h. Elemental analysis (Atlantic Microlab, Norcross, Ga.): C 53.37%, O 39.45%, H 1.62%, N 0.14%.

Figure 7:
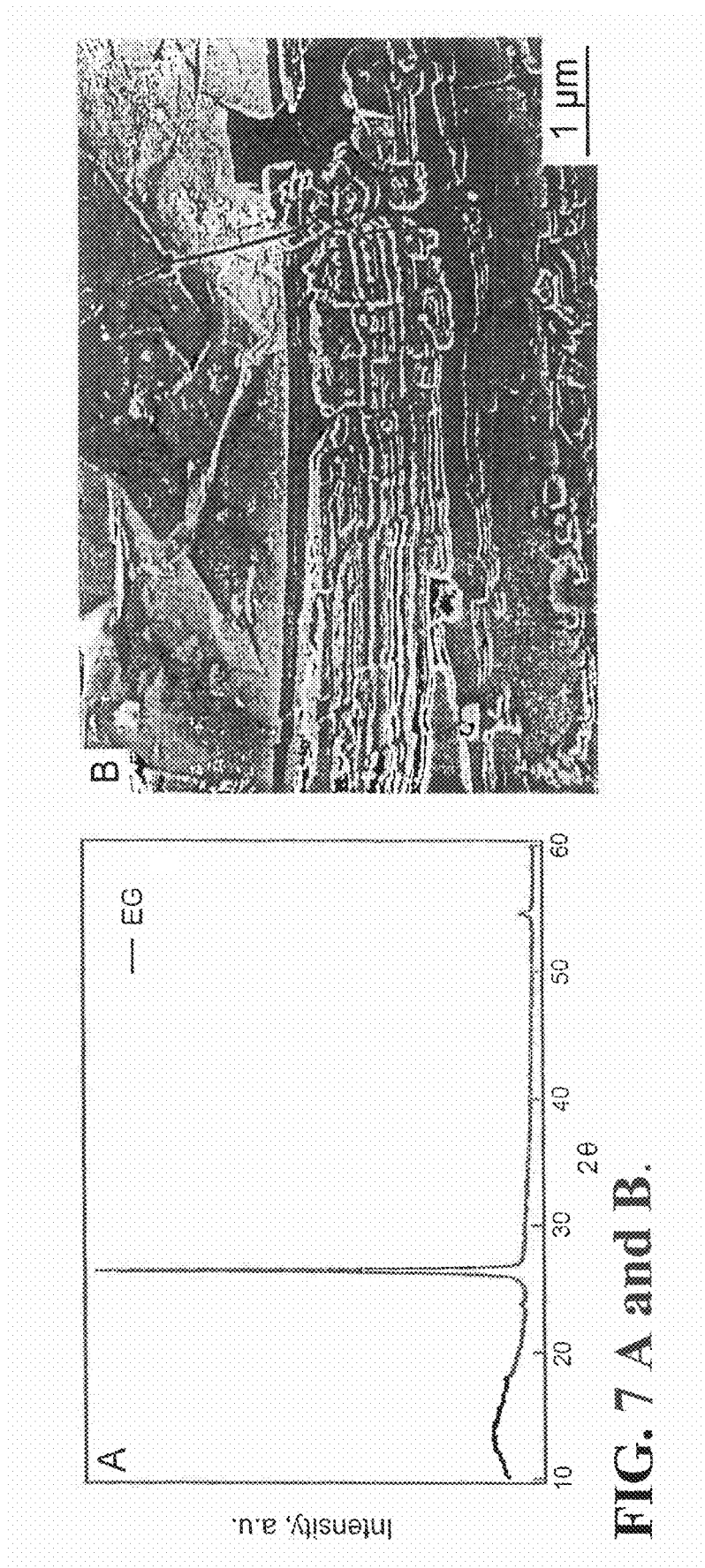
FIG. 7 shows (A) a XRD pattern of EG and (B) a SEM image of EG.

Preparation of Expanded Graphite (EG):
Flake 1 Graphite (1 g) was treated with 4:1 v/v mixture of concentrated sulfuric and nitric acid (50 ml) for 24 h at room temperature. Upon completion, the suspension was diluted with water (150 ml) and filtered. The solid residue was washed with copious amounts of water until the filtrate was no longer acidic. The resulting material was dried in an oven at 100° C. overnight. Next, the dried material was placed in a quartz tube and the tube heated rapidly with a propane blow torch (Model TX9, BernzOmatic, Medina, N.Y.) set at medium intensity while under dynamic vacuum to produce the expanded graphite (FIG. 7).

Preparation of Tego by Method A:
Graphite oxide (0.2 g) was placed in an alumina boat and inserted into a 25-mm ID, 1.3-m long quartz tube that was sealed at one end. The other end of the quartz tube was closed using rubber stopper. An argon (Ar) inlet and thermocouple were then inserted through the rubber stopper. The sample was flushed with Ar for 10 min, then the quartz tube was quickly inserted into a Lindberg tube furnace preheated to 1050° C. and held in the furnace for 30 s. Elemental analysis of a sample oxidized for 96 h indicates a C/H/O ratio of 54/25/21 (by mol) while the elemental analysis of TEGO shows an increase in C/O ratio from 6/4 in GO to 8/2.

Preparation of Tego by Method B:
Graphite oxide (0.2 g) was placed in a 75-ml quartz tube equipped with a 14/20 ground glass joint. The tube was evacuated and backfilled with nitrogen three times and then attached to a nitrogen bubbler. Next, the GO was heated rapidly with a propane blow torch (Model TX9, BernzOmatic, Medina N.Y.) set at medium intensity until no further expansion of graphite oxide was observed (typically 15 s.). Elemental Analysis: C 80.10%, O 13.86%, H 0.45%, N 0%.

Dispersion of TEGO in Organic Solvents:
The dispersions of TEGO were made at 0.25 mg/ml concentration by sonicating TEGO (prepared by method B, 5 mg) in a given solvent (20 ml) for 5 h in a Fisher Scientific FS6 ultrasonic bath cleaner (40 watt power). The dispersions were then left standing under ambient conditions.

The following was observed: TEGO dispersions in methylene chloride, dioxane, DMSO and propylene carbonate precipitated within 8 h after sonication. The dispersion in nitrobenzene was more stable, but after 24 h the precipitation of TEGO was complete. In THF, a moderately stable dispersion was observed accompanied by fairly substantial precipitation after 24 h. However, the THF dispersion still remained blackish after a week. More stable dispersions can be obtained in DMF, NMP, 1,2-dichlorobenzene, and nitromethane: they were still quite black after one week albeit with a small amount of sedimentation.

Figure 8:
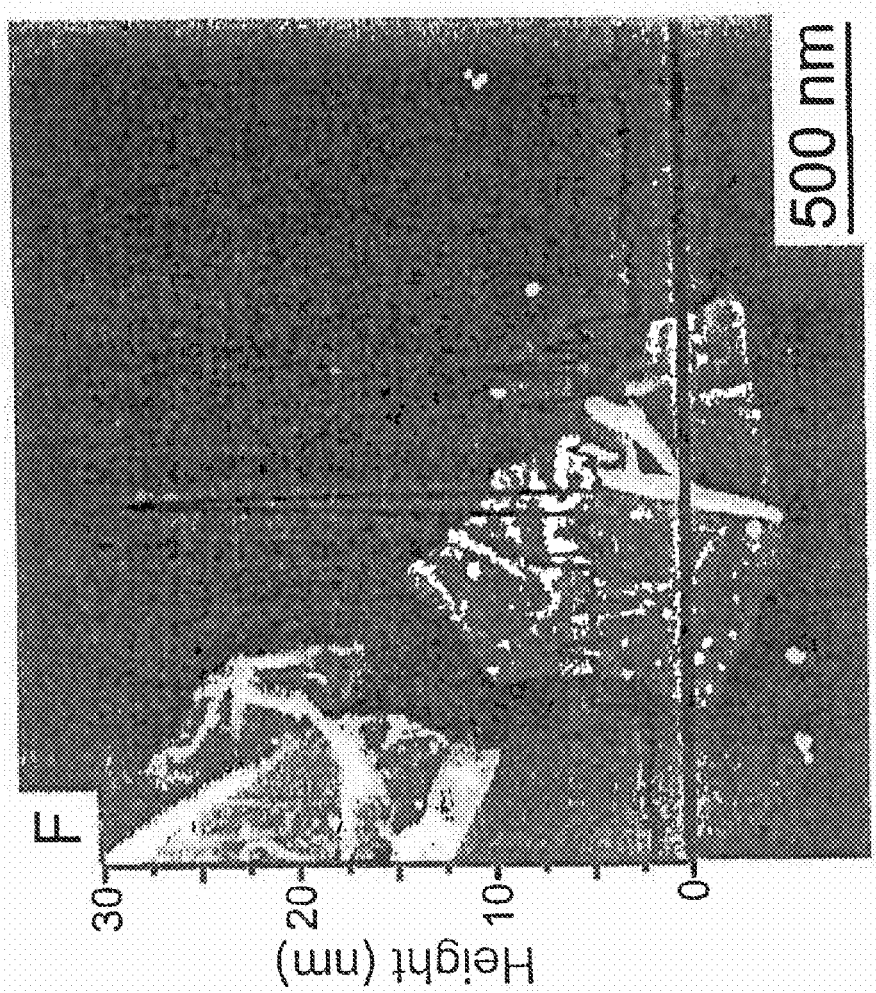
FIG. 8 shows an atomic force microscope (AFM) image illustrating the thin, wrinkled platelet structure. Superimposed on the image is the height profile taken along the indicated line scan. The average height is ~2.8 nm.

Experimental Procedure for the AFM Imaging:

The AFM images were taken on an AutoProbe CP/MT Scanning Probe Microscope (MultiTask), Veeco Instruments. TEGO was dispersed in 1,2-dichlorobenzene by sonication (vide supra) and the dispersion deposited on a freshly cleaved mica surface. Imaging was done in non-contact mode using a V-shape "Ultralever" probe B (Park Scientific Instruments, B-doped Si with frequency $f_c$=78.6 kHz, spring constants k=2.0-3.8 N/m, and nominal tip radius r=10 nm). All images were collected under ambient conditions at 50% relative humidity and 23° C. with and a scanning raster rate of 1 Hz. The AFM image in FIG. 8 shows stacks of TEGO nanostack with thickness of ~2 nm.

Figure 9:
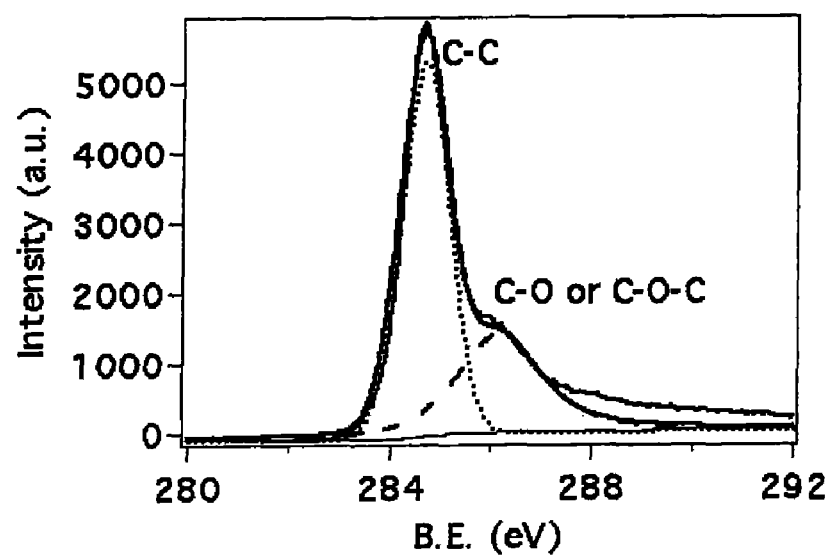
FIG. 9 shows the high-resolution X-ray photo electron (XPS) spectra of TEGO.

X-Ray Photoelectron Spectroscopy (XPS):

XPS measurements were performed using an Omicron ESCA Probe (Omicron Nanotechnology, Taunusstein, Germany) located at Northwestern University's Keck Interdisciplinary Surface Science Center with monochromated Al $K_\alpha$ radiation (hv=1486.6 eV). The sample was oriented with a 45° photoelectron take-off angle from the sample surface to the hemispherical analyzer. Data were collected using a 15-kV acceleration voltage at 20-mA power and vacuum of $10^{-9}$ mbar. An analyzer pass-energy of 50 eV with 500-meV steps was used for single-sweep survey scans. High-resolution spectra were averaged over three sweeps using an analyzer pass energy of 22 eV with 20-meV steps. TEGO samples were de-gassed overnight within the XPS chamber ($10^{-3}$ mbar) prior to analysis. The raw $C_{1s}$ XPS data (FIG. 9) were analyzed using multipak and XPS peak 41 fitting software to determine the relative peak locations and areas in relation to standard binding energies for known carbon functionalities (*Handbook of X-ray photoelectron spectroscopy*, edited by J. Chestain, R. C. King Jr., Physical Electronic, Inc., Eden Prairie, USA (1992)). The main component at 284.6 eV is attributed to C in C—C bond. An additional component at 286.1 eV is attributed to C in —C—O— or C—O—C moieties.

The atomic concentration was calculated from the relation (Surface analysis method in materials science, edited by D. J. O'Connor, B. A. Sexton, R. St. C. Smart, Springer-Verlag, Heidelberg, (1992)): $C=(I_i/S_i)/\Sigma_i (I_i/S_i)$, where $I_i$ is the peak intensity for element i and $S_i$ is the sensitive factor for the peak i. Sensitive factor for $C_{1s}$ is 1 and $O_{1s}$ is 2.85. From peak intensity integration, the oxygen concentration is calculated to be 8.4 atomic %.

Processing of Nanocomposites:

The TEGO used for nanocomposite was prepared via both methods A and B. Consistent composite properties were obtained regardless of the method of TEGO preparation. Depending on the wt % of the composite, each type of nano-filler was initially dispersed in tetrahydrofuran (THF, 10 ml) by bath sonication (Branson 3510, 335 W power) at room temperature. These solutions were then combined with a solution of PMMA in THF (10-30 ml). Shear mixing (Silverson, Silverson Machines, Inc., MA. USA) at 6000 rpm was then applied to the TEGO/PMMA and EG/PMMA systems for 60 min in ice-bath to reduce the frictional heat produced in polymer by the shear mixer while the SWNT/PMMA systems received additional bath sonication for 60 min (shear mixing was not used for SWNT/PMMA). The composite solutions were then coagulated with methanol, filtered under vacuum using polycarbonate filter paper (Millipore, Cat. No. TCTP04700; 10-μm pore size), and dried at 80° C. for 10 h to yield a solid flaky materials. Nano-filler/PMMA composite samples for mechanical testing were pressed into a thin film between stainless steel plates using 0.1-mm thick spacers in a Tetrahedron (San Diego, Calif.) hydraulic hot-press at 210° C. under 2 MPa to approximately 0.12-0.15 mm thickness. A neat PMMA control sample was prepared in the same manner.

Figure 10:
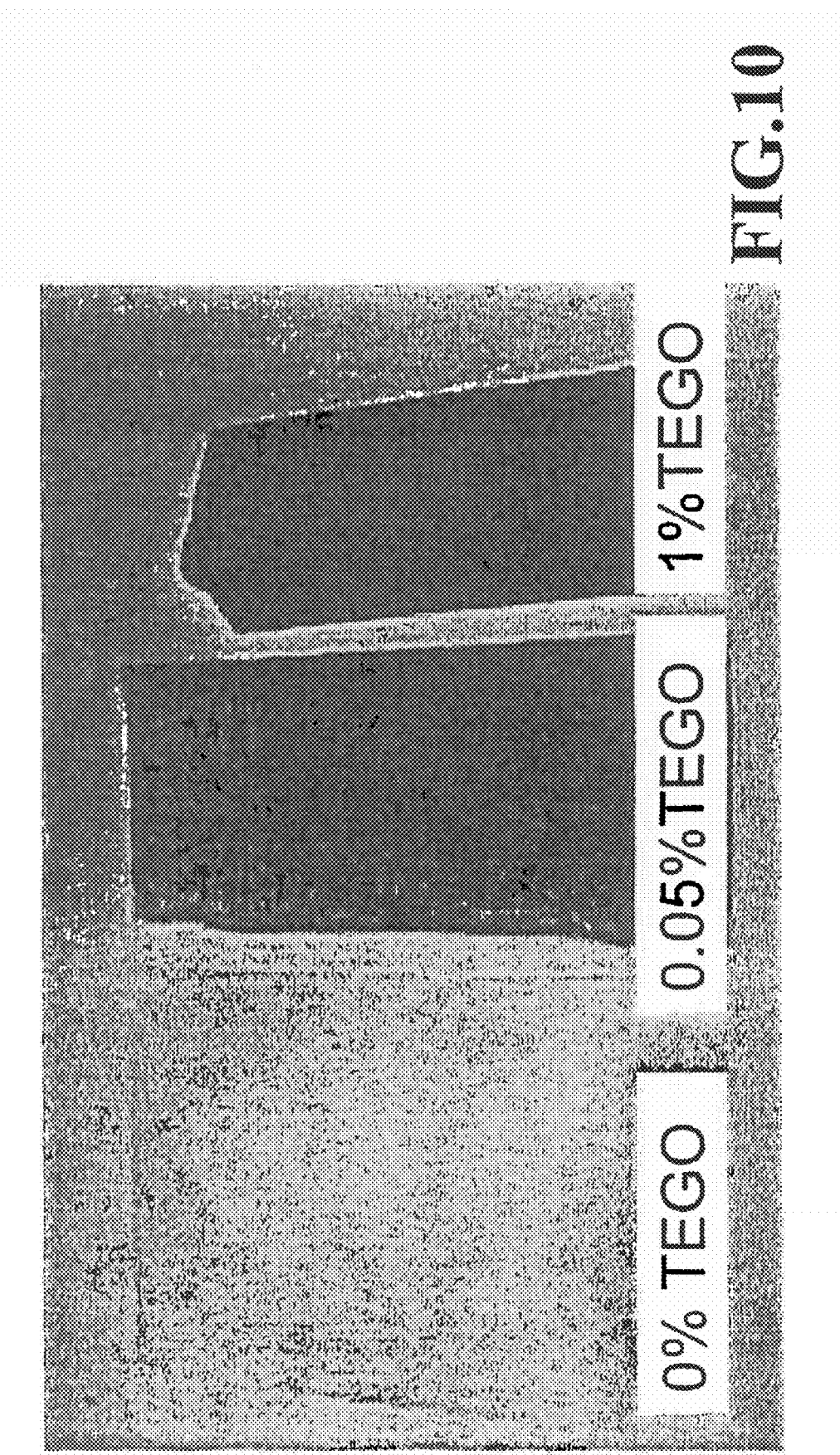
FIG. 10 shows digital image of TEGO/PMMA samples at differing weight fraction loadings.

Mechanical Analysis:

The viscoelastic response of these composites was measured using Dynamic Mechanical Analysis (DMA 2980, TA instruments, DE, USA). Strips of uniform width (6 mm) were cut from the film using a razor blade. A tensile force with 0.1-N pre-load was applied to the test specimen using a film tension clamp and dynamic oscillatory loading at a frequency of 1 Hz and amplitude of 0.02% strain was applied. Storage modulus (FIG. 10) and tan delta (FIG. 13) were obtained in temperature sweeps of 3° C./min. The stress-strain curves and ultimate strength of the composites were obtained according to ASTM D882 using Minimat (TA Instruments, Del., USA).

Figure 11:
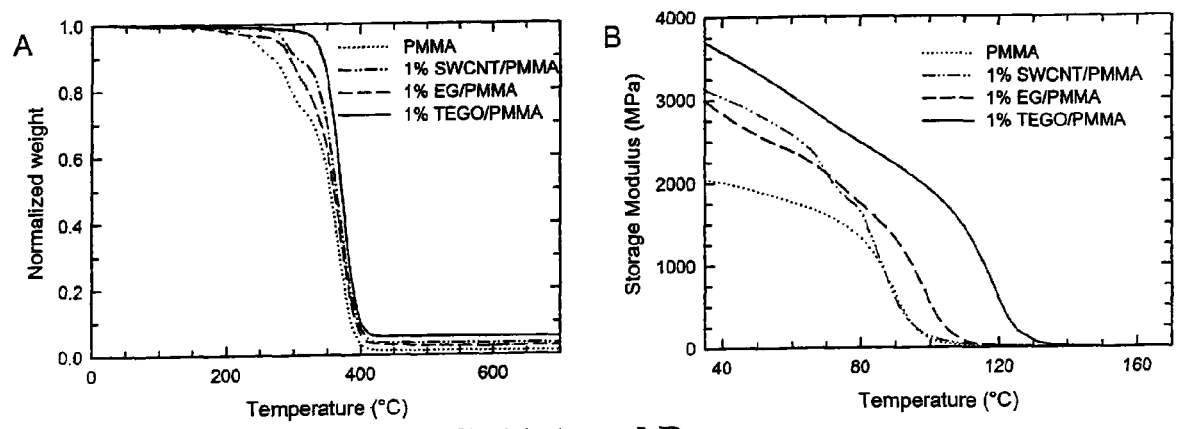
FIG. 11 shows (A) Thermal gravimetric analysis (TGA) traces showing the thermal degradation properties of different nanofillers-reinforced PMMA composites and (B) Storage modulus vs. temperature of different nano fillers in PMMA.

Thermal Property Measurements:

Thermal degradation properties of the composites were examined by thermal gravimetric analysis (TGA) on a TA Instruments SDT 2960 Simultaneous DTA-TGA instrument. Pieces of the composites (~10 mg) were loaded into to the TGA instrument and heated from 40° to 800° C. at a rate of 10° C. per minute under $N_2$ atmosphere. Data are shown in FIG. 11.

Figure 12:
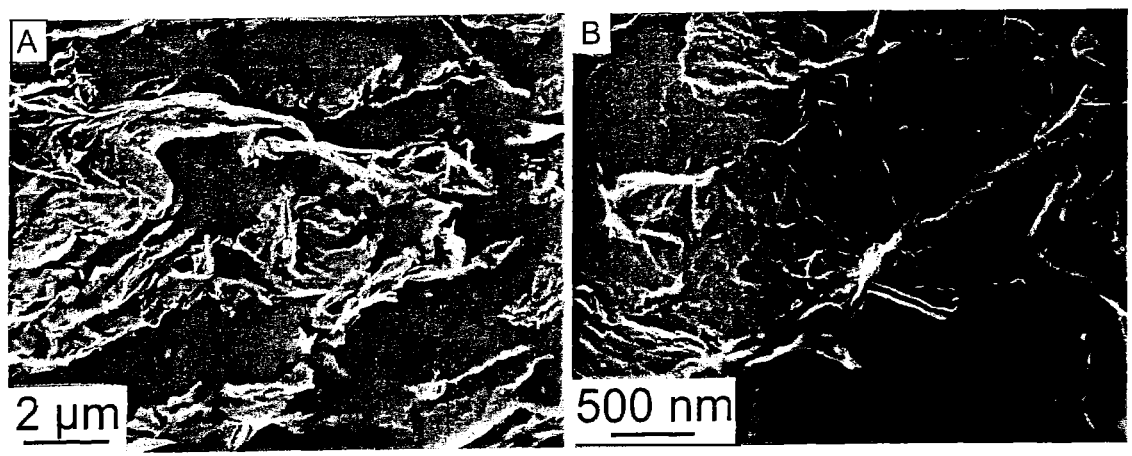
FIG. 12 shows in (A) and (B) Scanning electron microscope (SEM) images of TEGO-PMMA fracture surface. By using a high acceleration voltage (20 kV), the sub-surface morphology of TEGO nanoplates can be observed. The persistent wrinkled nature of the TEGO nanoplates within the composite provides for better interaction with the host polymer matrix.

Scanning Electron Microscopy (SEM):

SEM imaging was used to examine EG and TEGO morphology ex situ as well the fracture surfaces of the nanocomposites using a LEO 1525 SEM (LEO Electron Microscopy Inc, Oberkochen, Germany) (FIG. 12). Nanocomposite samples were mounted on a standard specimen holder using double-sided carbon conductive tape with the fracture surfaces toward the electron beam. An acceleration voltage was varied between 1 kV-20 kV depending on different imaging purposes and sample properties.

Figure 13:
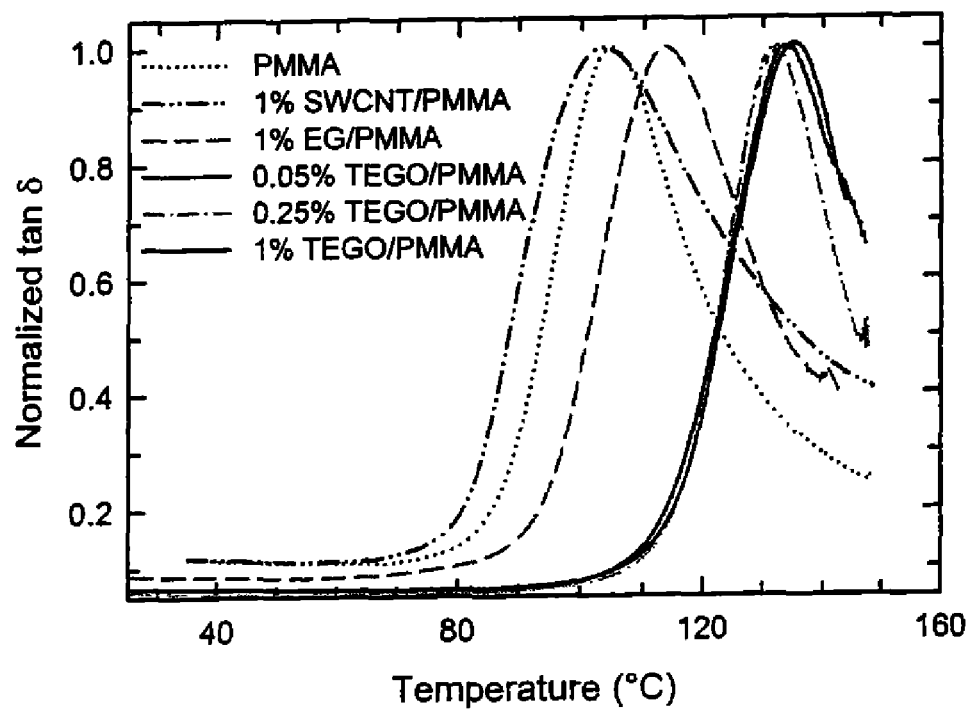
FIG. 13 shows normalized tan delta peaks from the dynamic mechanical analysis (DMA) showing a ~35° C. increase in $T_g$ (even at the lowest 0.05 wt % loading) for TEGO/PMMA over those observed for SWCNT/PMMA or EG/PMMA nanocomposites.

Glass Transition Temperature Measurements:

The glass transition temperature, $T_g$ of each composite was obtained from the tan delta peaks from the DMA experiment described in SI-5 (FIG. 13). DMA results (normalized tan delta peak) are shown for all nanocomposites at 1 wt % loading as well as for TEGO/PMMA at two lower wt % loadings. Results show a peak broadening but no shift in the $T_g$ for SWNT/PMMA and a modest increase in $T_g$ for EG/PMMA. TEGO/PMMA nanocomposite shows a rheological percolation even at the lowest wt % measured, 0.05%, with a nearly-constant $T_g$ shift of 35° C. for all wt % measured.

Figure 15:
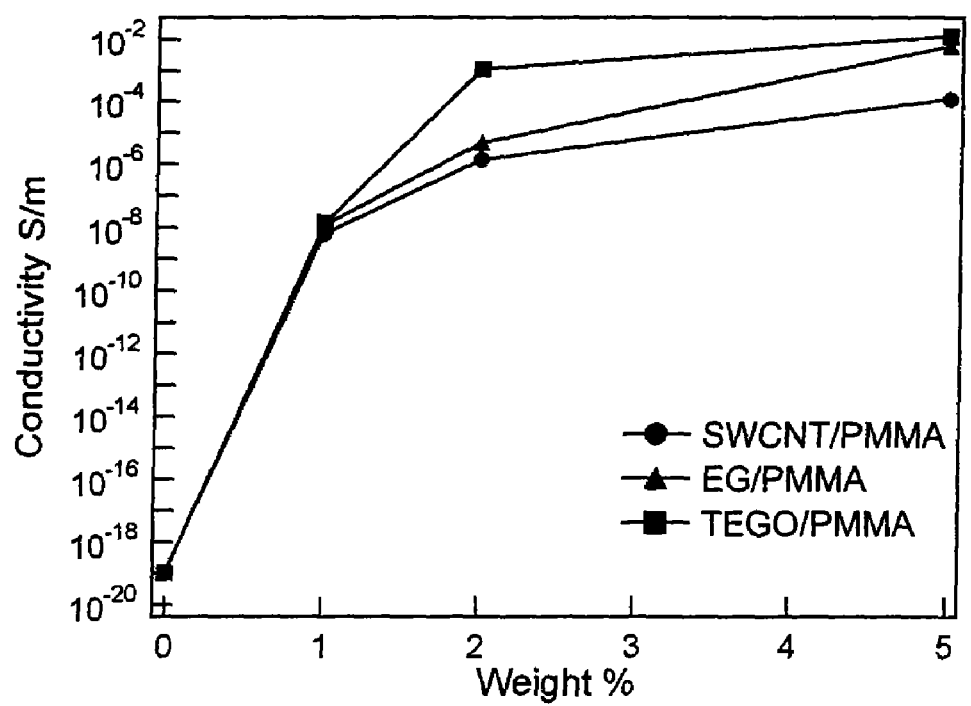
FIG. 15 shows electrical conductivity of TEGO/PMMA nanocomposites as a function of filler content based on transverse AC measurements.

AC Conductivity Measurements:

Composite samples were microwave plasma-etched (Plasma-Preen II-862, Plasmatic Systems, N.J.) for 1 min at 2 Torr of $O_2$ and 350 W of power. AC impedance measurements were performed using an impedance analyzer (1260 Solartron, Hampshire, UK) with a 1296 Solarton dielectric interface. The specimen was sandwiched between two copper electrodes that are held tightly together with two 2-mm thick polycarbonate plates. Electrically conductive colloidal graphite (Product no. 16053, Ted Pella Inc., Redding Calif., USA) was applied between the sample and copper electrode to avoid point-contacts caused through surface roughness of the nano-composites. Impedance values were taken for the nanocomposites between $0.01$-$10^6$ Hz. Conductivity of the polymer nanocomposites (see FIG. 15) is taken from the plateau at low frequencies at 0.1 Hz.

Figure 14:
FIG. 14 shows a schematic of the current distribution through the composite sample resulting from a voltage bias applied between two metal electrodes (light grey).

DC Conductivity Measurements:

Hot-pressed composite samples having thickness about 0.1 mm were cut into strips that are 1-2 mm wide and 15-20 mm long. The strips were microwave plasma -etched (Plasma-Preen II-862, Plasmatic Systems, N.J.) for 1 min at 2 Torr of $O_2$ and 350 W of power. Subsequently, 25-nm thick gold films were thermally deposited on the specimen surfaces: four pads on one side of the composite strip for the longitudinal measurements and one pad on two opposing sides of the strip for the transverse measurements. Pad spacing for longitudinal measurement were always 0.16 mm (determined by mask geometry during the deposition). Pad spacing for transverse measurements were preset by the sample thickness. Copper wires were attached to these gold-plated pads using silver-filled epoxy ($H_2$0E, EPO-TEK, MA). Four-point probe DC-resistive measurements were performed using an HP multimeter (HP34401A). As a first approximation, the composite electrical resistivity was calculated from known specimen geometry. In these initial results, longitudinal and transverse resistivities diverged considerably, especially for EG-filled composites. Transverse resistivities were always higher than longitudinal ones. However longitudinal measurements, considering the electrical leads configuration, include both longitudinal, $I_t$ and transverse, $I_l$ components of the current path (FIG. 14). In order to separate these two components, the current distribution across the specimen was modeled based on the finite-element method (Femlab 3.1, Comsol AB). For each measured sample, we input actual specimen and electrical pads geometry, transverse resistivity, and longitudinal resistance to obtain the computed longitudinal resistivities that are reported in this paper.

X-Ray Diffraction (XRD) Measurement XRD patterns of graphite, GO, and TEGO are recorded in a Rigaku MiniFlex diffractometer with Cu Kα radiation. Initial, final and step angles were 5, 30 and 0.02° respectively.

Example 1

Graphite oxide was prepared from graphite by a process of oxidation and intercalation, referred to as the Staudenmaier method. The method uses a combination of oxidizers and intercalants: sulfuric acid, nitric acid and potassium chlorate under controlled temperature conditions. Ratios of graphite to potassium chlorate in the range of 1:8 to 1:20 (wt/wt) are preferred. Ratios of sulfuric to nitric acid from 5:1 to 1:1 are preferred. The Staudenmaier method is the preferred oxidation procedure.

In this example, 5 g graphite flake with a 400 μm average flake size (Asbury Carbon, Asbury, N.J.) was added to an ice-cooled solution containing 85 ml sulfuric acid and 45 ml nitric acid. This was followed by the addition of 55 g potassium chlorate over 20 minutes such that the temperature did not exceed 20° C. After this oxidation/intercalation process proceeded for 96 hours, the reaction mixture was poured into 7 l of deionized water and filtered using an aspirator. The oxidized graphite was then washed with 5% HCl until no sulfate ions were detected in the filtrate, using the barium chloride test. The oxidized graphite was then washed with DI water until the filtrate had a pH of 5 or greater. The sample was examined by XRD to demonstrate complete oxidation by the elimination of the original sharp diffraction peak of graphite.

Example 2

In preparing thermally exfoliated graphite oxide (TEGO), graphite oxide (0.2 g) was placed in a ceramic boat and inserted into a 25 mm ID, 1.3 m long quartz tube that was sealed at one end. The other end of the quartz tube was closed using a rubber stopper. An argon (Ar) inlet and thermocouple were then inserted through the rubber stopper. The sample was flushed with Ar for 10 minutes; the quartz tube was then quickly inserted into a preheated Lindberg tube furnace and heated for 30 seconds.

Example 3

XRD patterns of graphite, GO, and TEGO were recorded in a Rigaku MiniFlex diffractometer with Cu Kα radiation. Initial, final and step angles were 5, 30 and 0.02, respectively. The surface area of TEGO was measured by nitrogen adsorption at 77K using a Micromeritics FlowSorb apparatus with a mixture of $N_2$ and He 30/70 by volume as the carrier gas. High-resolution XPS spectra were obtained using an Omicron ESCA Probe (Germany). Samples were de-gassed overnight within the XPS chamber (10-3 mbar) prior to analysis of the sample. Data were collected using 15 kV and 20 mA power at 10-9 mbar vacuum. The raw XPS data were analyzed to determine peak locations and areas in relation to specific binding energies that best fit the experimental data. The main C—C peak ($C_{1s}$) at 284.6 eV was observed. An additional photoemission present at higher binding energy peaks at 286.1 eV represented —C—O— or C—O—C bonding.

Example 4

The solid-state magic angle spinning (MAS) 13C NMR spectrum of the graphite oxide was obtained using a Chemagnetics CMX-II 200 spectrometer with a carbon frequency of 50 MHz, a proton frequency of 200 MHz, and a zirconia rotor of 7.5 mm diameter spinning at 4000 Hz. To enable separation of the carbon peaks of the solid GO sample a so called, "Block pulse sequence" was used. This employs a decay pulse sequence with a 45° pulse angle of 2.25 ms, high-power proton decoupling (~50 kHz), and a 20 s delay between pulses. The spectrum was run at room temperature and 5120 scans were acquired with 4 K data points each. The chemical shifts were given in ppm from external reference of the hexamethylbenzene methyl peak at 17.4 ppm.

Example 5

FIG. 1 shows the XRD diffraction patterns of the graphite flakes after oxidation for 48, 96, 120 and 240 hours. Note that as oxidation proceeds, a new peak characteristic of GO appears at a d-spacing of about 0.7 nm (2θ=12.2°), and the intensity of the native graphite 002 peak (2θ=26.7°) decreases significantly. Note also that after oxidation for 96 hours or longer, the graphite 002 peak essentially disappears. At this point, intercalation is achieved, as the graphene layers are no longer about 0.34 nm apart (as they were initially), but are now about 0.71 nm apart. The graphite oxide samples having d spacings of about 0.71 nm correspond to about 12% adsorbed water.

Example 6

Figure 2:
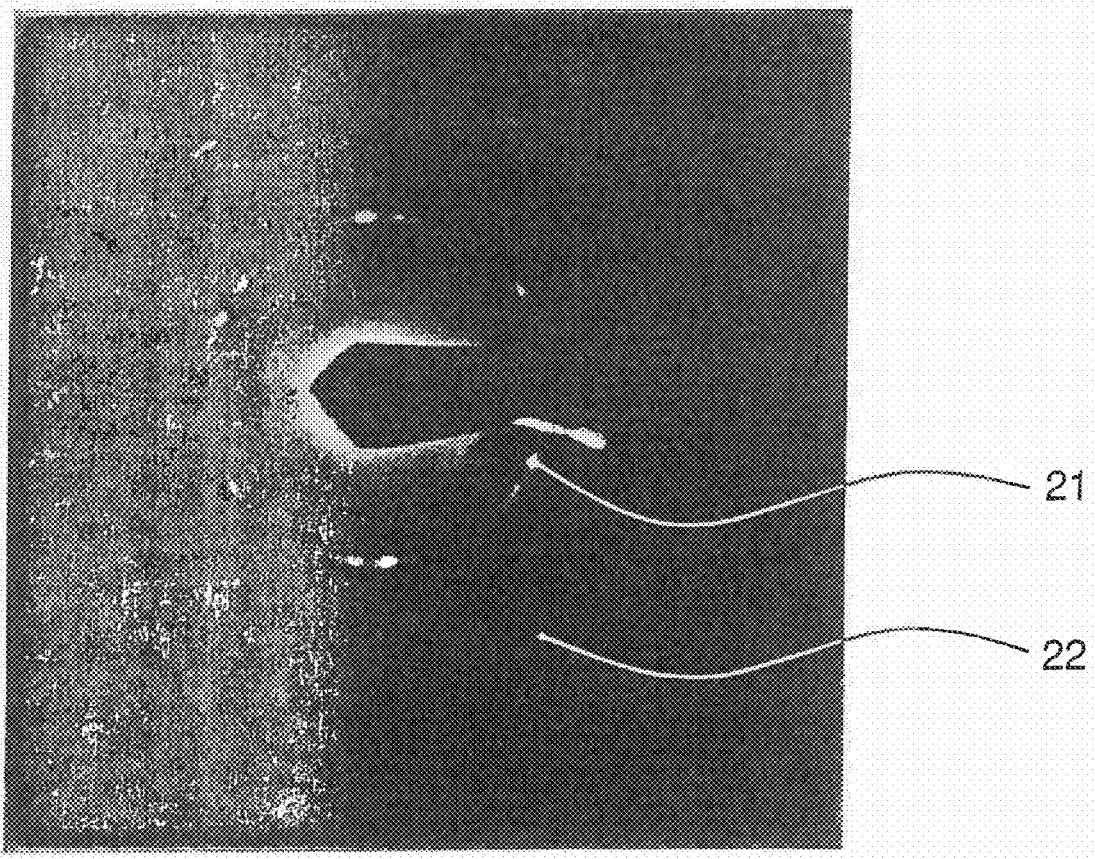
FIG. 2 shows selected area electron diffraction (SAED) patterns of GO oxidized for 96 hours, and the structure in the diffraction rings from stack spacing in GO.

The selected area electron diffraction (SAED) pattern of the oxidized, but not exfoliated, sample is shown in FIG. 2. SAED patterns are observed by focusing beam at a selected area to obtain electron diffraction information on the structure of matter. The SAED was taken over a large area; therefore, it contains the information from many GO grains. A typical sharp, polycrystalline ring pattern is obtained. The first ring 21 originates from the (1100) plane, with the second ring 22 arising from the (1120) plane. In addition, strong diffraction spots were observed on the ring. The bright spots corresponding to the (1100) reflections within the ring retain the hexagonal symmetry of the [0001] diffraction pattern. It is therefore postulated that the GO sheets, before thermal treatment, are not randomly oriented with respect to one another, and the interlayered coherence is not destroyed at this stage.

Example 7

It is further postulated that GO contains aromatic regions composed entirely of $sp^2$ carbon bonds and aliphatic $sp^3$ regions that contain hydroxyl, epoxy, and carboxylic groups.

Figure 3:
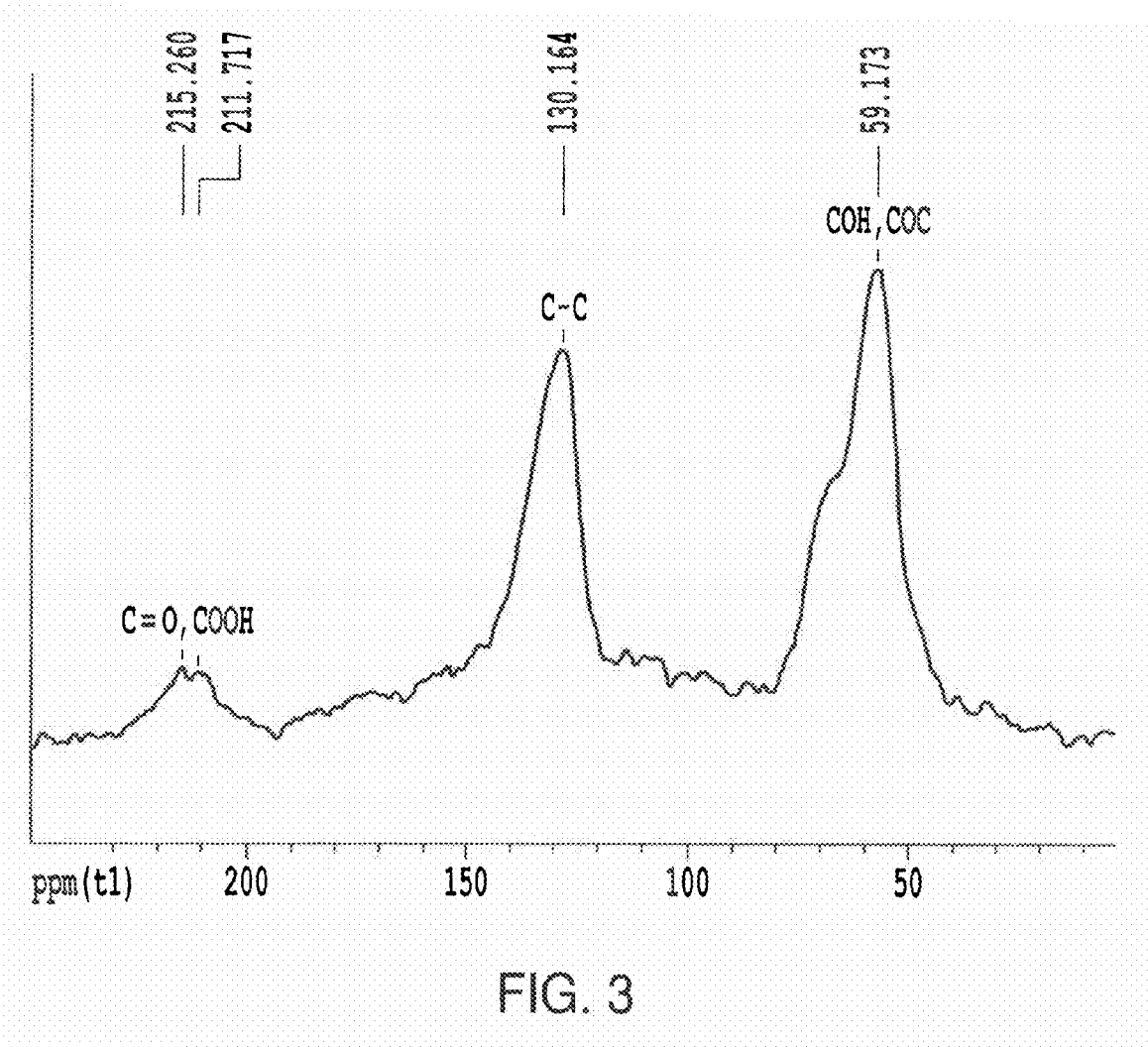
FIG. 3 illustrates a solid-state 13C-NMR spectra of GO, with the sample oxidized for 96 hours.

Elemental analysis of a sample oxidized for 96 hours indicates a C/H/O ratio of 54/25/21 (by mol). The $^{13}$C-NMR spectrum for a sample oxidized for 96 hours is shown in FIG. 3. The spectrum contains three distinguishable peaks, at chemical shifts (δ) of about 60-70, 133, and 210-220 ppm. The peak between 60 and 70 ppm is anticipated to be composed of two peaks, which can be assigned to hydroxyl and epoxy groups. The peak at 133 ppm corresponds to aromatic carbons, while the third peak at 210-220 ppm may be assigned to carbon attached to carbonyl oxygen.

Example 8

In an exemplary embodiment, in order to form TEGO, a graphite oxide sample that has been oxidized for 96 hours is heated under argon for 30 seconds at different temperatures. It was found that heating the expanded GO at 200° C. is sufficient for partial exfoliation. However, the extent of exfoliation increases as the temperature increases. The exfoliation results in a large apparent volume expansion (about 200-400 times the original volume). The TEGO prepared from completely oxidized samples has a fluffy "black ice-like" structure. FIGS. 4a and 4b show the XRD spectrum of graphite, GO oxidized for 96 hours, and a TEGO sample prepared by rapid heating of the GO sample. TEGO samples show no sign of the 002 peak for either the graphite oxide (2θ=12.2°) or for the pristine graphite (2θ≈26.5°). In contrast, heating a partially oxidized sample yields an XRD diffraction pattern that contains the 002 peak of the pristine graphite, as shown in FIG. 4b.

Example 9

Large area SAED patterns (FIG. 5) demonstrate enhanced exfoliation of the layers. The diffusion rings (51 and 52) are very weak and diffuse. These weak and diffuse diffraction rings, typically observed with disordered or amorphous materials, suggest that the alignment between the sheets and the long-range coherence along the c direction is essentially lost in the thermal exfoliation.

Due to the elimination of water and some oxygen functional groups during the rapid heating step, the structure of TEGO has a higher C/O ratio than the parent GO. Elemental analysis shows an increase in the C/O ratio of from 6/4 in GO to 8/2 in TEGO.

Figure 6:
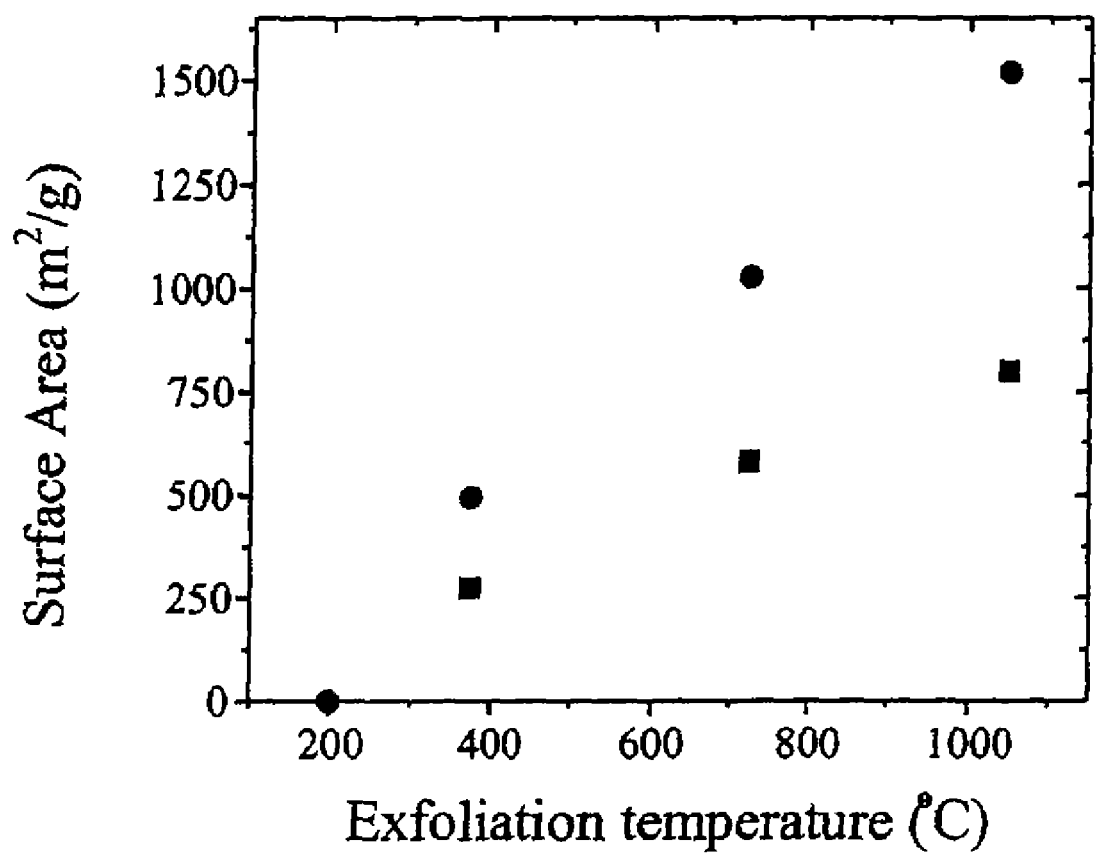
FIG. 6 shows BET surface area of TEGO samples prepared by heating GO samples at different temperatures for 30 seconds.

The surface area of TEGO samples prepared from a GO sample that was oxidized for 120 hours and heated for 30 seconds at different temperatures is shown in FIG. 6 ("●" denotes samples dried in vacuum oven for 12 hours at 60° C., and "■" represents samples equilibrated at ambient temperature and relative humidity prior to exfoliation).

Note that there is an increase in the surface area as the heating temperature increases. Surface areas of 1500 m²/g are achieved by heating the sample at 1030° C. This value is lower than a theoretical upper surface area of atomically thick graphene sheets, typically 2,600 m²/g. Since the adsorption experiment takes place on a bulk TEGO sample, part of the graphene sheets overlap, thus denying access to $N_2$ molecules, resulting in a lower surface area value. An important aspect for applications involving graphene in polymer matrices is the degree of dispersion, or the effective surface area, in the dispersed state. The TEGO materials disperse readily in polar organic solvents such as THF to form a uniform dispersion. Heating temperatures of from about 250-2500° C. may be employed, with a temperature range of from about 500-1500° C. preferred.

The bulk density of a TEGO sample with a surface area of 800 m²/g was measured gravimetrically to be 4.1 kg/m³. Another sample with a measured surface area of 1164 m²/g had a bulk density of 1.83 kg/m³.

Example 10

Figure 16:
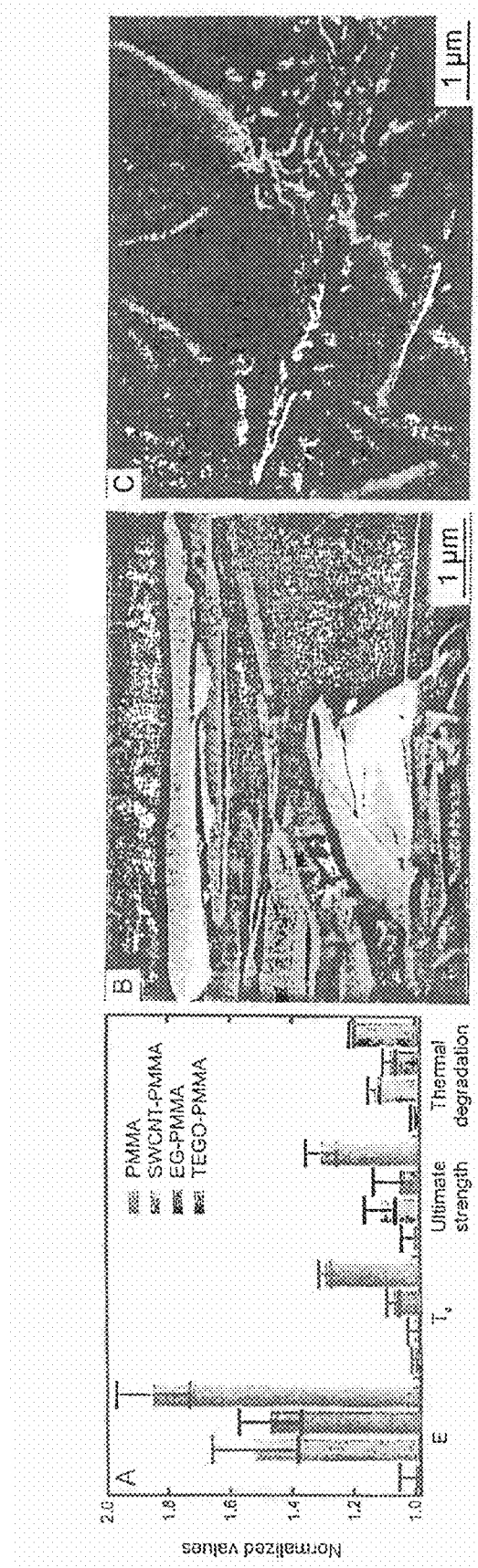
FIG. 16 shows in (A) a summary of thermomechanical property improvements for 1 wt % TEGO-PMMA compared to SWCNT-PMMA and EG-PMMA composites. All property values are normalized to the values for neat PMMA and thus relative to unity on the scale above. Neat PMMA values are E (Young's modulus)=2.1 GPa, $T_g$ (glass transition temperature)=105° C., ultimate strength=70 MPa, thermal degradation temperature=285° C. (B and C) SEM images of EG-PMMA vs. TEGO-PMMA, respectively: The size scale (nanoplate thickness) and morphology (wrinkled texture) of the TEGO nanoplates as well as their surface chemistry lead to strong interfacial interaction with the host polymer as illustrated by the fracture surface (C). In contrast, simple expanded graphite exhibits thicker plates with poor bonding to the polymer matrix (B).

For a comparative study of polymer nanocomposite properties, TEGO, SWCNT, and EG were incorporated into PMMA using solution-based processing methods. Thin-film samples (~0.1-mm thick) were prepared using a hot press and fully characterized for thermal, electrical, mechanical, and rheological properties (FIG. 16A). Examination of the fracture surface of EG-PMMA and TEGO-PMMA nanocomposites (FIGS. 16B, 16C) reveals an extraordinary difference in the interfacial interaction between the polymer matrix and the nanofiller in these two systems. While the multilayer EG fillers protrude cleanly from the fracture surface indicating a weak interfacial bond, the protruding TEGO plates of the present invention are thickly coated with adsorbed polymer indicating strong polymer-TEGO interaction. The present inventors suggest that two main differences between EG and TEGO lead to these interaction differences: First, distortions caused by the chemical functionalization of the "$sp^2$" graphene sheet and the extremely thin nature of the nanoplates lead to a wrinkled topology at the nanoscale. This nanoscale surface roughness leads to an enhanced mechanical interlocking with the polymer chains and consequently, better adhesion. Such an effect is in agreement with the recent suggestion by molecular dynamic studies that show altered polymer mobility due to geometric constraints at nanoparticle surfaces. Second, while the surface chemistry of EG is relatively inert, TEGO nanoplates contain pendant hydroxyl groups across their surfaces, which may form hydrogen bonds with the carbonyl groups of the PMMA. Together with TEGO's high surface area and nanoscale surface roughness, this surface chemistry is believed to lead to stronger interfacial bonding of TEGO nanoplates with PMMA and thus substantially larger influence on the properties of the host polymer.

In polymer nanocomposites, the very high surface-to-volume ratio of the nanoscale fillers provides a key enhancement mechanism that is equally as important as the inherent properties of the nanofillers themselves. Because the surface area of the nanofiller particles can fundamentally affect the properties of the surrounding polymer chains in a region spanning several radii of gyration surrounding each individual nanoparticle, it is most preferred to have an optimal dispersion of the particles within the polymer matrix. The high surface area and oxygen functional groups in the present invention TEGO nanoplates offer a superb opportunity to achieve outstanding dispersion and strong interfacial properties of nanofiller in polymers. While SWCNTs may offer similar potential without the inherent chemical functionality, in practice it has proven difficult to extract SWCNTs from their bundles to obtain dispersions to the individual tube level which limits their enhancement potential.

In FIG. 16A, the thermal and mechanical properties for all three of the aforementioned thin-film samples are provided. Although both glass transition temperature ($T_g$) and thermal degradation temperature for PMMA increased significantly in the presence of the nanofillers, the TEGO-PMMA nanocomposites significantly outperformed both the EG-PMMA and the SWCNT-PMMA materials. The glass transition, $T_g$, data are particularly striking: an unprecedented shift of 35° C. occurred for the TEGO-PMMA composite at only 0.05 wt % of the nanofiller. Although the SWCNT-PMMA composite exhibited a broadening of the loss peak, indicating additional relaxation modes in the polymer, no significant shift of $T_g$ was observed even at 1 wt % loading. While the SWCNTs were well distributed in the matrix and well wetted by the polymer, there was evidence of localized clustering leading to nanotube-rich and nanotube-poor regions in the composite. Consequently the SWCNT-PMMA composite retained the rheological signature of bulk PMMA. For the EG-PMMA composite, although no clustering of the EG platelets was observed, the platelets were thicker, resulting in a decrease of the surface area in contact with the polymer and a smaller $T_g$ shift compared to TEGO-PMMA composites. Functionalization of SWCNTs can lead to better dispersion and a similar $T_g$ shift in SWCNT-PMMA composites, but only at 1 wt % loading. Furthermore, functionalizing SWCNTs requires an additional processing step that is not needed for the TEGO material. In the TEGO nanocomposites, good dispersion of the nanoplate filler and strong interaction with the matrix polymer resulted in overlapping interaction zones between the nanoparticles in which the mobility of the polymer chains was altered, leading to a shift in the bulk $T_g$ of the nanocomposite at very low weight fractions.

The room temperature values for tensile Young's modulus (E), ultimate strength, and the values for storage modulus at elevated temperatures followed a similar trend: the values for TEGO-PMMA exceeded those for SWCNT- and EG-PMMA composites. This increased enhancement in mechanical properties for TEGO-PMMA nanocomposite can again be attributed to the superior dispersion of the TEGO in the polymer matrix and their intimate interactions. Even with the partial clustering of the SWCNTs and the lower surface area of the EG platelets, some enhancement of polymer properties was observed; however, the TEGO nanoplates are believed to fundamentally alter the behavior of the entire polymer matrix even at low wt % loadings.

While GO itself is electrically non-conducting, an important feature of TEGO is its substantial electrical conductivity. The longitudinal electrical conductivity of our TEGO-PMMA nanocomposite greatly surpasses those of pure PMMA and SWCNT-PMMA nanocomposites (Table 1).

TABLE 1

Electrical conductivity of different nanoscale reinforcements in PMMA at 5 wt % loading. Conductivity measured by AC impedance spectroscopy through the thickness for transverse values and measured by a four-probe steady-state method along the length of the samples for longitudinal values.

|  | DC transverse conductivity (S/m) | DC longitudinal conductivity (S/m) |
|---|---|---|
| PMMA | <1E-10 | <1E-10 |
| SWCNT/PMMA | 4.7E-03 | 0.5 |
| EG/PMMA | 1.1E-03 | 33.3 |
| TEGO/PMMA | 2.9E-02 | 4.6 |

That the composites of the present invention approach the conductivity value measured for the EG-PMMA system suggests the presence of a significant conjugated carbon network in the thin TEGO nanoplates consistent with the observation that GO underwent partial deoxygenation (reduction) during its rapid high temperature exfoliation into TEGO. The data obtained in the comparison also indicate that all three nanocomposite samples were anisotropic, yielding a significantly higher conductivity longitudinally at the same percolation threshold (1-2 wt % level, FIG. 15). For the 5 wt % samples, basic geometric constraints dictate that the nanoplates cannot be oriented randomly in space. For flat disks with an aspect ratio of 100, complete random orientation is possible only at volume fractions less than 5% using an Onsager-type model. As the TEGO nanoplates and processed EG have aspect ratios of ~250-1000, an isotropic arrangement is not possible. This geometric constraint, combined with the hot-press processing method used to prepare the nanocomposite samples, thus results in partial orientation of the nanoplates parallel to the top and bottom faces of the samples. The EG/PMMA had a higher anisotropy ratio ostensibly due to the more rigid nature of the thicker plates, leading to more longitudinal alignment and higher conductivity. As the conductivity of filled composites is controlled by the filler's conductivity and contact resistance between filler particles and the number of filler contacts, it appears that the combination of flexibility and crumpling morphology of the TEGO plates, together with their exceedingly high aspect ratio, enables percolation at low concentrations. The longitudinal conductivity of the present invention TEGO-PMMA sample was several times that quoted for 4-6 wt % iodine-doped polyacetylene blended with polyethylene (1 S/m).

That the conductivity of 5 wt % TEGO-PMMA composite is quite close to the conductivity for several commercially important conducting polymer such as polythiophene and polyaniline opens up potential uses for TEGO-polymer nanocomposites in electronic and photonic applications. In addition, since single-layer graphene has been dubbed a zero-gap semiconductor or small overlap semi-metal as well as the material of choice for true nanoscale metallic transistor applications, novel graphite oxide-derived nanosize conducting materials such as TEGO offer very attractive opportunities indeed.

Example 11

Mechanical Properties of TEGO Filled Polymer Nanocomposites

Figure 17:
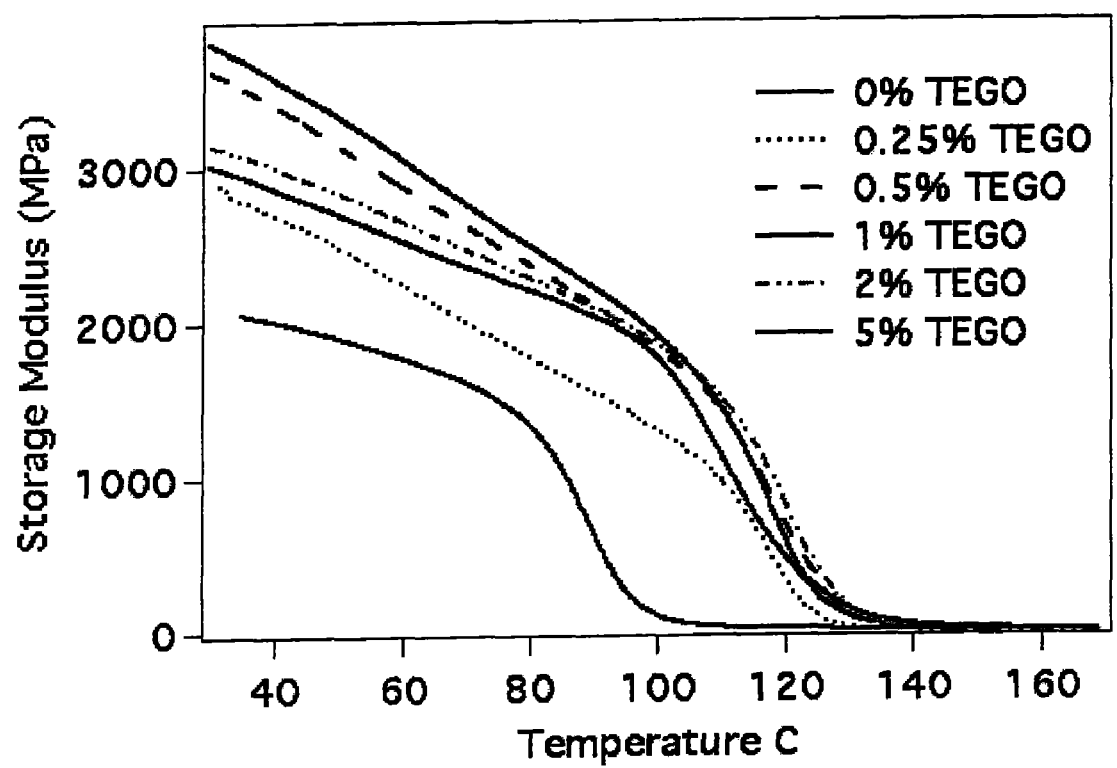
FIG. 17 shows storage modulus vs. temperature response of different weight % of TEGO in TEGO/PMMA composite.
Figure 18:
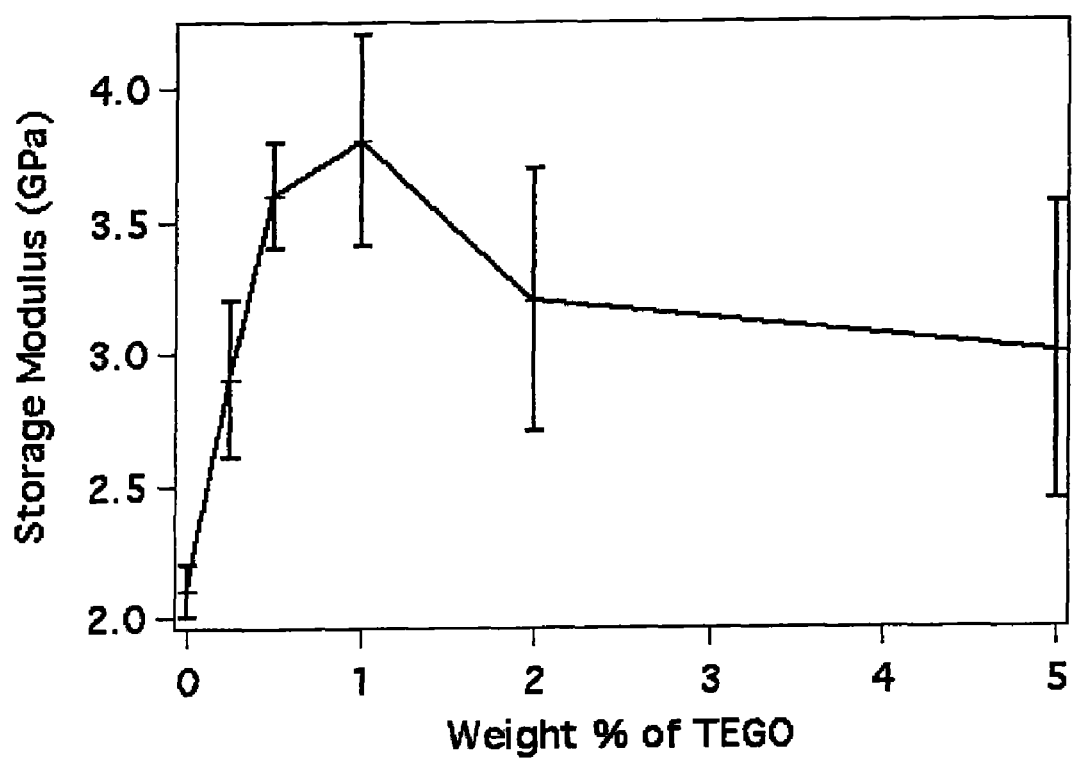
FIG. 18 shows a RT storage modulus (GPa) vs. weight % of TEGO/PMMA composite.

TEGO/PMMA composites with different weight percentages such as 0.25, 0.5, 1, 2, and 5% were prepared using a solution evaporation technique. TEGO/PMMA composite thin films were made using a hot-press molding method. Viscoelastic response of these composites was measured using Dynamic Mechanical Analysis (DMA). Strips of uniform width composite film were cut from the film using a razor blade. A tensile force with 0.1N pre-load was applied to the test specimen using a 'film tension clamp' in DMA. Then the specimen had applied to it, a dynamic oscillatory force with frequency of 1 Hz. The dynamic properties such as storage modulus (E'), loss modulus (E") and tan δ values were measured with temperature sweep between 25° C. and 170° C. at the rate of 3° C./min. Storage modulus (E') vs. temperature response is shown in FIG. 17. Storage modulus increment is in the range from 40% for 0.25% weight of TEGO to the maximum of 85% for 1% weight of TEGO than that of PMMA. Further increasing the TEGO concentration decrease the storage modulus. Storage modulus (average taken from 4 or 5 samples for each weight percent) vs. weight percentage of TEGO is shown in FIG. 18.

Figure 19A:
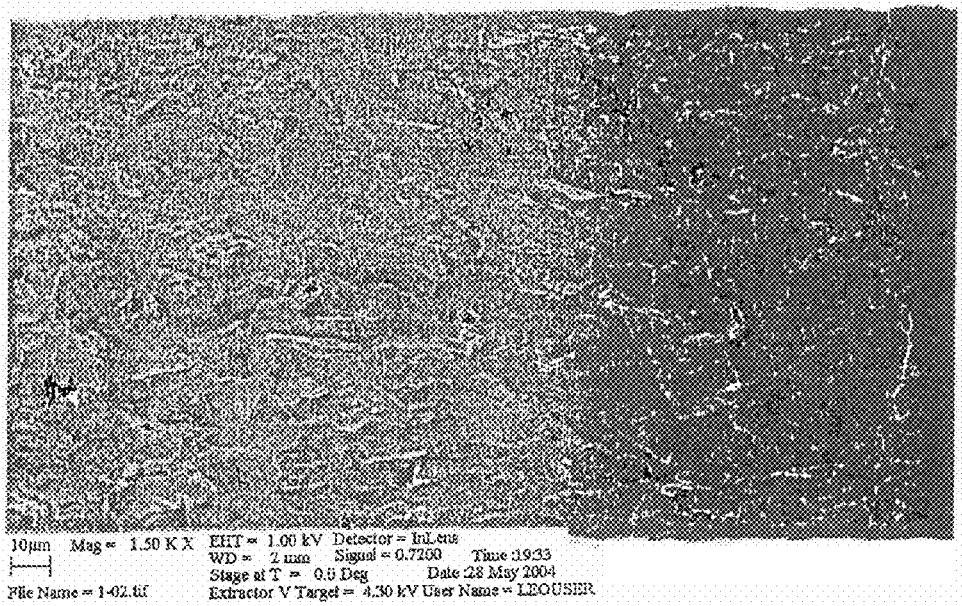
FIG. 19 shows a SEM picture of (a) 1 weight % and (b) 5 weight % of TEGO/PMMA composites.
Figure 19B:
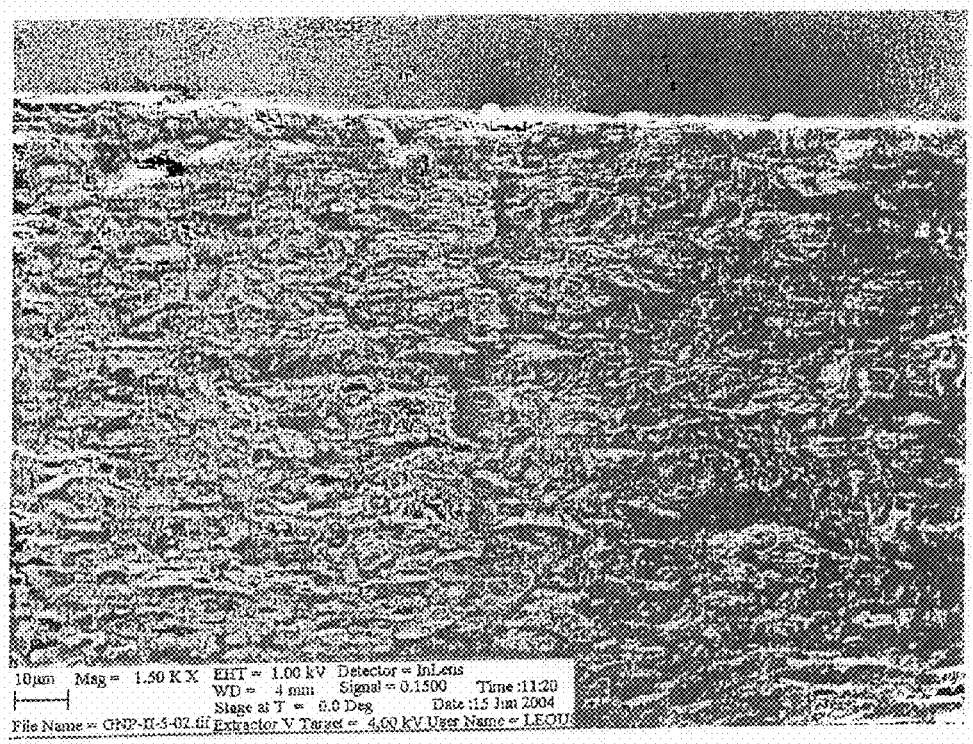

It is believed that the reason for decrease in storage modulus for higher TEGO content may be due to cavities (voids) or clumping of particles, which are seen in SEM pictures in FIG. 19. The storage modulus for expanded graphite in each of (EG)/PMMA and (EG)/PE has been previously shown to increase with filler content up to a few weight percent. However, the surface of the expanded graphite and TEGO are quite different from each other. The presence of oxide in the surface of TEGO may create a strong mechanical interaction or interlocking between the polymer and reinforcement particles. In addition, the TEGO platelets are considerably thinner than the EG plates. Consequently, the limiting volume fraction for ideal, isolated plate, random dispersion without encountering effects of particle clumping will preferably be lower for the TEGO particles. The samples here at 1 wt % exhibit an increase of modulus of nearly 100%, while the published data on EG/PMMA achieved an increase of only 10%.

Figure 20:
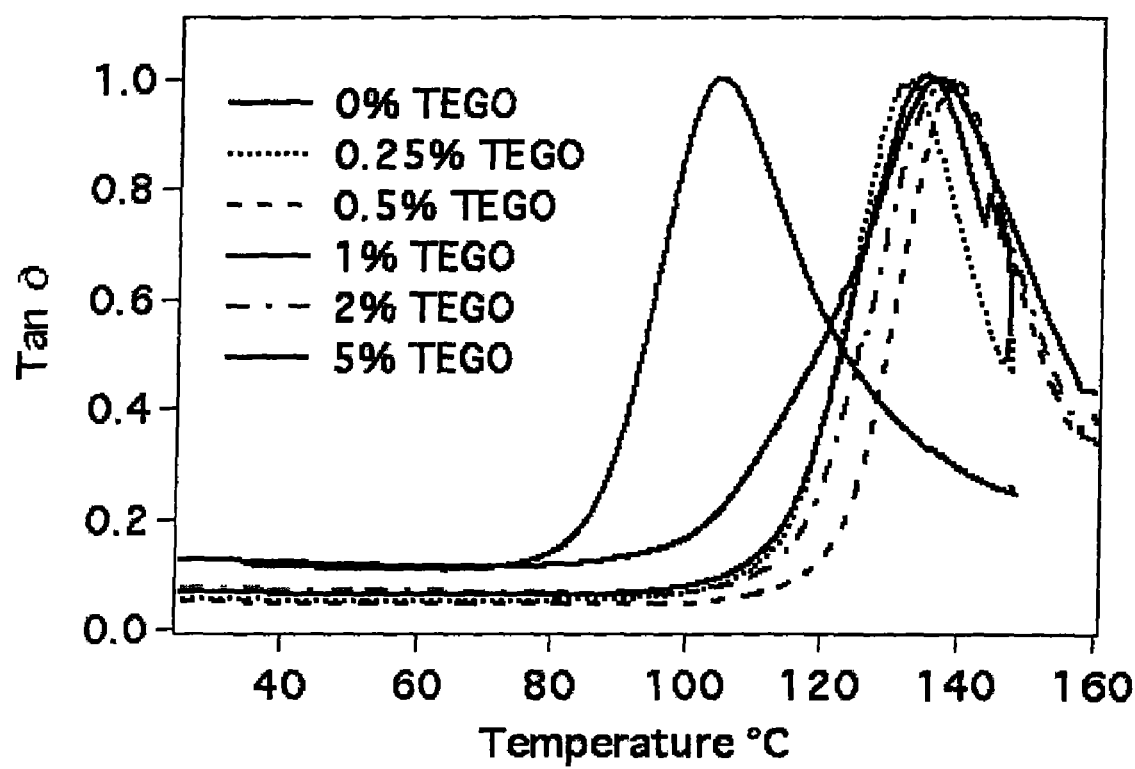
FIG. 20 shows normalized tan delta with temperature sweep of different weight % of TEGO/PMMA composite.

FIG. 20 shows that a significant shift is seen in the tan δ peak for TEGO/PMMA composites. The glass transition temperature is normally measured using the tan δ peak. It is evident that Tg is nearly 40% higher for TEGO/PMMA composite than pure PMMA, compared to the reported EG/PMMA composites which showed only a 12%-20% increment in Tg by tan δ peak shift for composites with 1 wt %-3 wt % respectively. An interesting feature in Tg is that the tan δ peak shift is nearly constant for all volume fractions, but the peak broadens considerably with the higher volume fractions. Since the Tg is related to the molecular mobility of the polymer, it may considered to be affected by molecular packing, chain rigidity and linearity. Since the TEGO plates have a high surface area and thickness on the order of the Rg for a polymer chain, well-dispersed TEGO can have a significant impact on a large volume fraction of local polymer. In this manner, the interaction of the polymer chains with the surface of the particles can drastically alter the chain kinetics in the region surrounding them even at lower reinforcement content. From FIG. 20, it is evident that chain mobility is altered at the low concentrations and increasing reinforcement loading appears not to change the major shift in Tg but instead to add additional relaxation modes, perhaps by interconnectivity of the particles at higher loadings. The translation of Tg is indicative that the TEGO particle interaction with the polymer matrix is nearly all-inclusive: very little "bulk" polymer remains. A consistent result on Tg was observed by DSC experiment for these composite samples.

Figure 21:
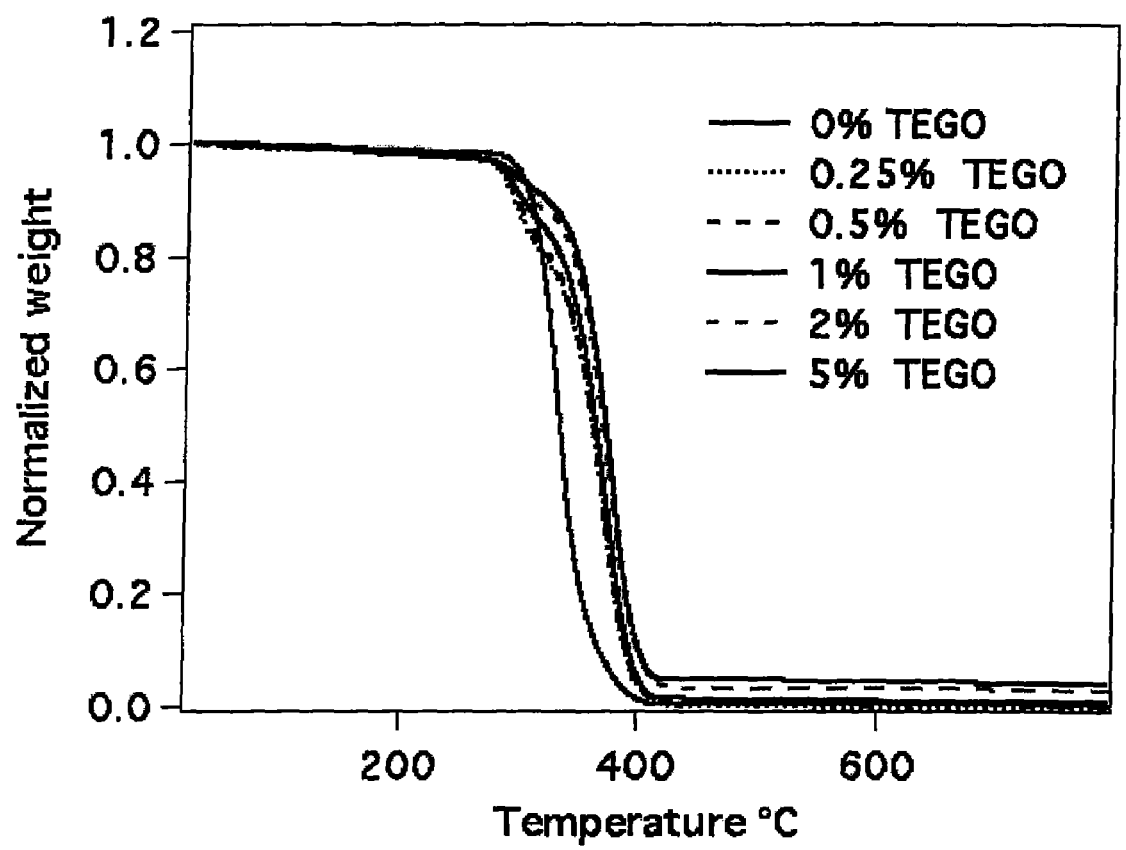
FIG. 21 shows thermal degradation of TEGO/PMMA composite by TGA analysis.

FIG. 21 shows the thermal degradation of the samples. It is clearly seen that the degradation temperature for the composites are shifted up to 15% higher than that of pure polymer. Again, this is viewed as evidence that the TEGO plates are acting to change the nature of the polymer as a whole in the composite.

Figure 22:
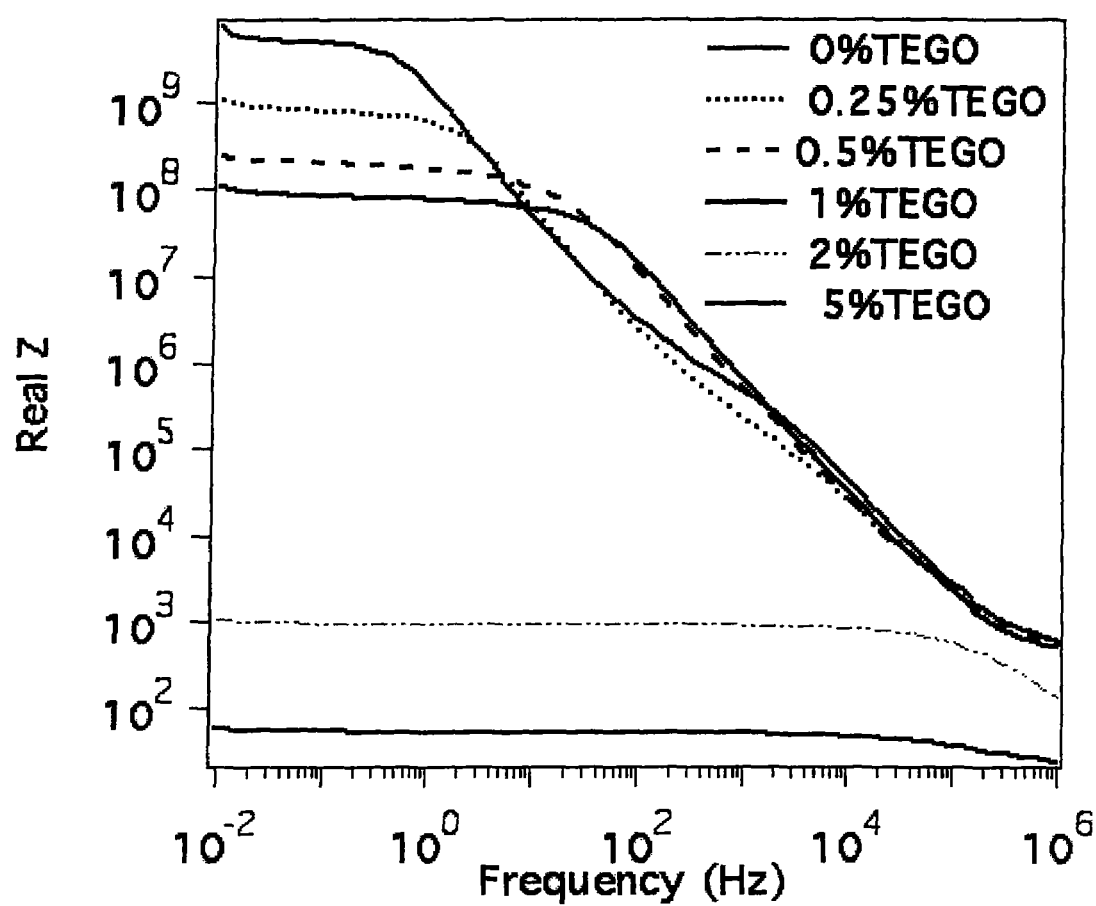
FIG. 22 shows real Z vs. frequency response of TEGO/PMMA composite.

AC impedance measurements at room temperature were recorded using a Solartron 1290 impedance analyzer with a 1296 dielectric interface. The sample was sandwiched between two rectangular copper electrodes with dimension of 21 mm×6 mm held tight to the specimen by two flat polycarbonate plates. Electrically conductive paste (graphite particle filled epoxy) was applied between the copper electrode and sample in order to eliminate the point contacts due to the surface roughness of the composite surface. FIG. 22 shows that a significant reduction in the real Z (resistance) is observed with increasing reinforcement filler content. A sharp decease of real Z for 2% and higher TEGO concentration indicates the onset of electrical percolation. Increase of electrical conductivity has been previously reported for EG/PMMA and graphite/PMMA composites over that of pure PMMA. Further the literature suggests that the difference in conductivity behavior between EG/PMMA and graphite/PMMA at higher filler concentration is due to the enhanced number of conductivity paths in the EG composites. Similar results were reported in HDPE/graphite composites with different filler sizes. The electrical conductivity of the present invention composites exhibited a pronounced transition with the increase of filler content, from an insulator to nearly a semiconductor at the percolation limit.

All references cited herein are incorporated by reference.

Numerous modifications and variations on the present invention are possible in light of the above teachings. It is therefore to be understood that within the scope of the appended claims, the invention may be practiced otherwise than as specifically described herein.

The invention claimed is:

1. An automotive body panel, comprising a polymer composite, wherein the polymer composite comprises at least one polymer and a thermally exfoliated graphite oxide having a surface area of from about 300 m$^2$/g to 2600 m$^2$/g.

2. The automotive body panel of claim 1, wherein the thermally exfoliated graphite oxide has a surface area of from about 400 m$^2$/g to 2600 m$^2$/g.

3. The automotive body panel of claim 1, wherein the thermally exfoliated graphite oxide has a surface area of from about 500 m$^2$/g to 2600 m$^2$/g.

4. The automotive body panel of claim 1, wherein the thermally exfoliated graphite oxide has a bulk density of from about 40 kg/m$^3$ to 0.1 kg/m$^3$.

5. The automotive body panel of claim 1, wherein the thermally exfoliated graphite oxide has a C/O ratio of from about 60/40 to 95/5.

6. The automotive body panel of claim 5, wherein the thermally exfoliated graphite oxide has a C/O ratio of from about 65/35 to 85/15.

7. The automotive body panel of claim 1, wherein the at least one polymer comprises one or more polymers selected from the group consisting of polyethylene, polypropylene and copolymers thereof, polyesters, nylons, polystyrenes, polycarbonates, polycaprolactones, polycaprolactams, fluorinated ethylenes, polyvinyl acetate and its copolymers, polyvinyl chloride, polymethylmethacrylate and acrylate copolymers, high impact polystyrene, styrenic sheet molding compounds, polycaprolactones, polycaprolactams, fluorinated ethylenes, styrene acrylonitriles, polyimides, epoxys, polyurethanes, poly[4,4'-methylenebis(phenyl isocyanate)-alt-1,4-butanediol/poly(butylene adipate)], poly[4,4'-methylenebis(phenyl isocyanate)-alt-1,4-butanediol/poly(butylene adipate)], poly[4,4'-methylenebis(phenyl isocyanate)-alt-1,4-butanediol/poly(butylene adipate)], poly[4,4'-methylenebis(phenyl isocyanate)-alt-1,4-butanediol/di (propylene glycol)/polycaprolactone, poly[4,4'-methylenebis(phenyl isocyanate)-alt-1,4-butanediol/polytetrahydrofuran, amine terminated polybutadienes, carboxyl terminated polybutadienes, polybutadiene, dicarboxy terminated butyl rubber, styrene/butadiene copolymers, polyisoprene, poly(styrene-co-butadiene), polydimethysiloxane, and natural latex rubber.

8. The automotive body panel of claim 7, wherein the at least one polymer comprises one or more polymers selected from the group consisting of polyethylene, polypropylene and copolymers thereof, polyesters, nylons, polystyrenes, polycarbonates, styrene/butadiene copolymers, and high impact polystyrene.

9. The automotive body panel of claim 1, wherein the thermally exfoliated graphite oxide has a surface area of from about 300 $m^2/g$ to 1100 $m^2/g$.

10. The automotive body panel of claim 1, wherein the polymer composite comprises between 0.1 and 20 weight percent thermally exfoliated graphite oxide, based on the total weight of the composite.

11. The automotive body panel of claim 1, wherein the polymer composite comprises between 0.1 to 5 weight percent thermally exfoliated graphite oxide, based on the total weight of the composite.

12. The automotive body panel of claim 1, wherein the polymer composite comprises between 1.5 and 5 weight percent thermally exfoliated graphite oxide, based on the total weight of the composite.

13. The automotive body panel of claim 1, wherein the polymer composite comprises between 0.5 to 2 weight percent thermally exfoliated graphite oxide, based on the total weight of the composite.

* * * * *